US011195817B2

(12) United States Patent
Huang et al.

(10) Patent No.: US 11,195,817 B2
(45) Date of Patent: Dec. 7, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Shih-Ya Huang, Hsinchu (TW); Chung-Hao Tsai, Changhua County (TW); Chen-Hua Yu, Hsinchu (TW); Chuei-Tang Wang, Taichung (TW); Chih-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 113 days.

(21) Appl. No.: 16/666,388

(22) Filed: Oct. 28, 2019

(65) Prior Publication Data

US 2021/0125960 A1 Apr. 29, 2021

(51) Int. Cl.
*H01L 25/065* (2006.01)
*H01L 23/538* (2006.01)
*H01L 23/31* (2006.01)
*H01L 25/00* (2006.01)
*H01L 23/40* (2006.01)

(52) U.S. Cl.
CPC ...... *H01L 25/0652* (2013.01); *H01L 23/3128* (2013.01); *H01L 23/4012* (2013.01); *H01L 23/5383* (2013.01); *H01L 25/50* (2013.01); H01L 2225/06548 (2013.01)

(58) Field of Classification Search
CPC ............ H01L 25/0652; H01L 23/3128; H01L 23/4012; H01L 23/5383
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |

(Continued)

*Primary Examiner* — Marc Anthony Armand
(74) *Attorney, Agent, or Firm* — JCIPRNET

(57) ABSTRACT

A semiconductor package includes a redistribution structure, a memory wafer, semiconductor dies and conductive vias. The memory wafer, disposed over the redistribution structure, includes at least one memory die. The semiconductor dies are disposed side by side with respect to each other, between the memory wafer and the redistribution structure, and are electrically connected to the redistribution structure. The conductive vias electrically connect the at least one memory die with the redistribution structure. A semiconductor package includes a redistribution structure, a reconstructed wafer, and a heat sink. The reconstructed wafer is disposed on the redistribution structure. The reconstructed wafer includes logic dies and memory dies. The logic dies are electrically connected to the redistribution structure. The memory dies are electrically connected to the redistribution structure and vertically stacked with the logic dies. The heat sink is disposed on the reconstructed wafer. The heat sink is fastened to the reconstructed wafer.

20 Claims, 25 Drawing Sheets

(56) References Cited

U.S. PATENT DOCUMENTS

| | | |
|---|---|---|
| 9,281,254 B2 | 3/2016 | Yu et al. |
| 9,368,460 B2 | 6/2016 | Yu et al. |
| 9,372,206 B2 | 6/2016 | Wu et al. |
| 9,373,605 B1 * | 6/2016 | Wang .................. H01L 23/5385 |
| 9,496,189 B2 | 11/2016 | Yu et al. |
| 2010/0072606 A1 * | 3/2010 | Yang ....................... H01L 24/82 |
| | | 257/692 |
| 2017/0033080 A1 * | 2/2017 | Chen .................. H01L 23/3114 |
| 2018/0076179 A1 * | 3/2018 | Hsu ......................... H01L 24/17 |

* cited by examiner

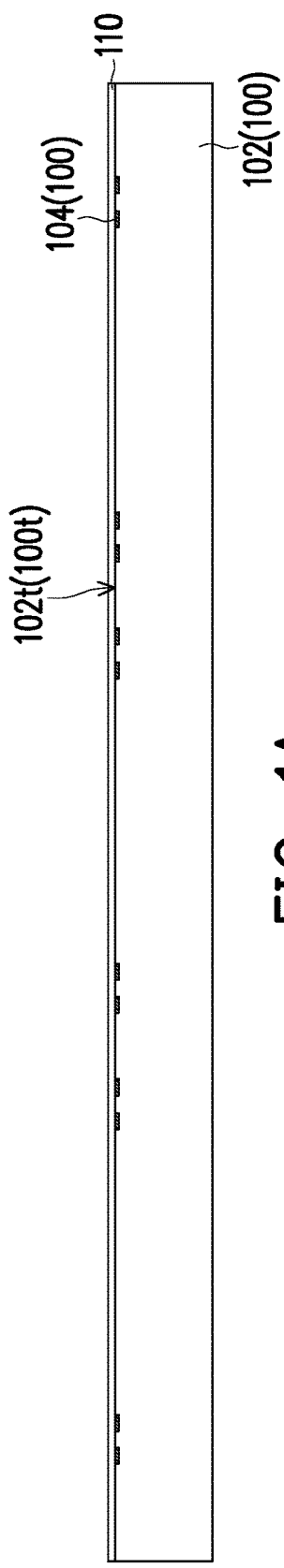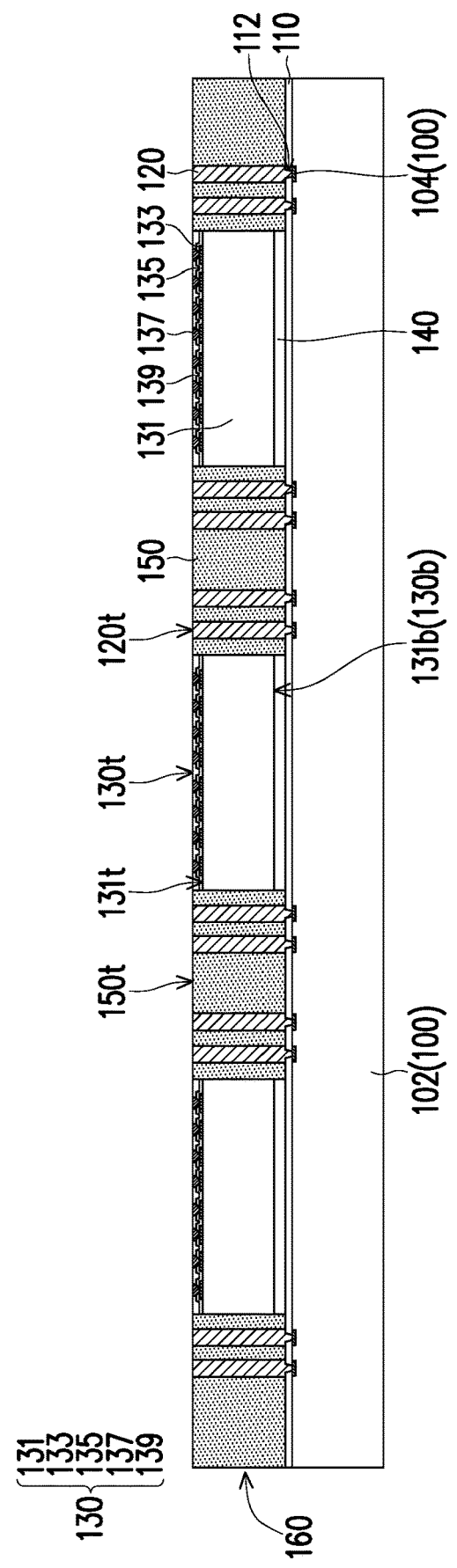

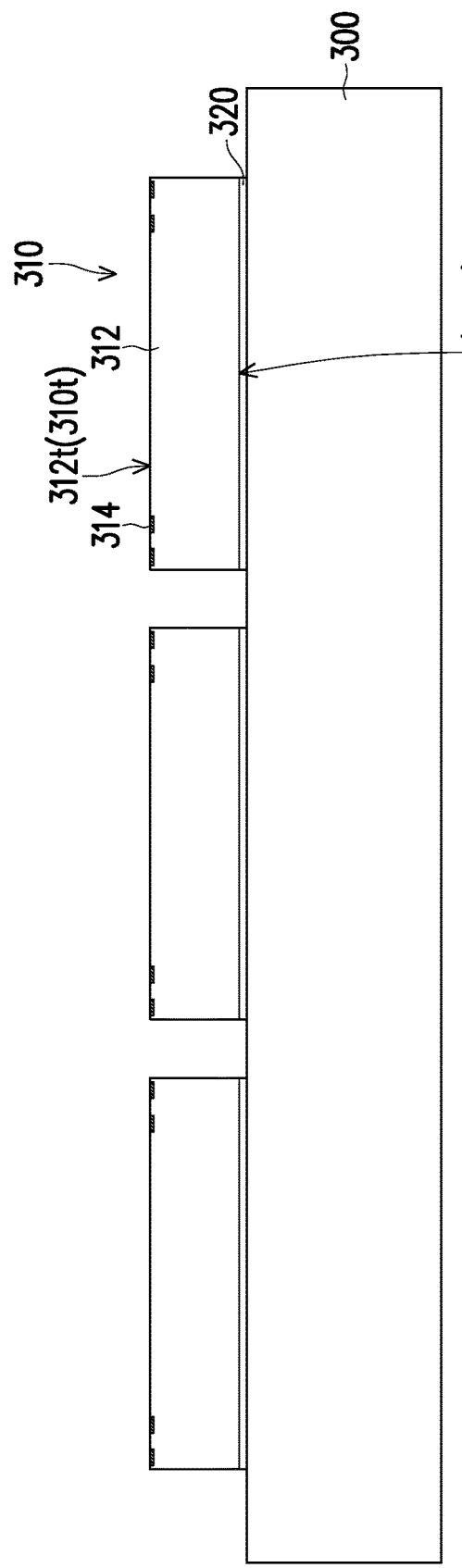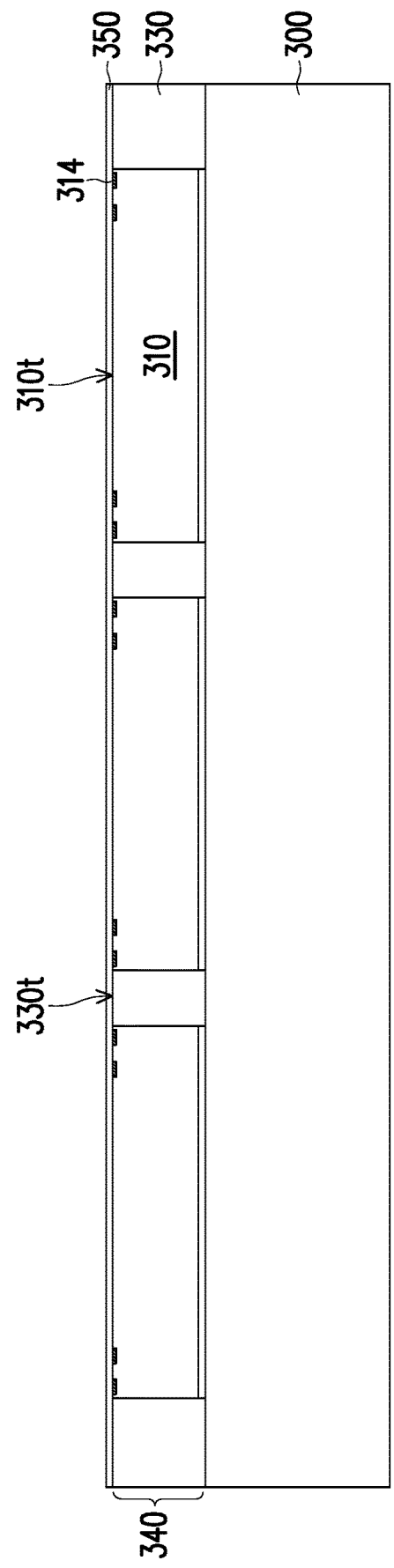

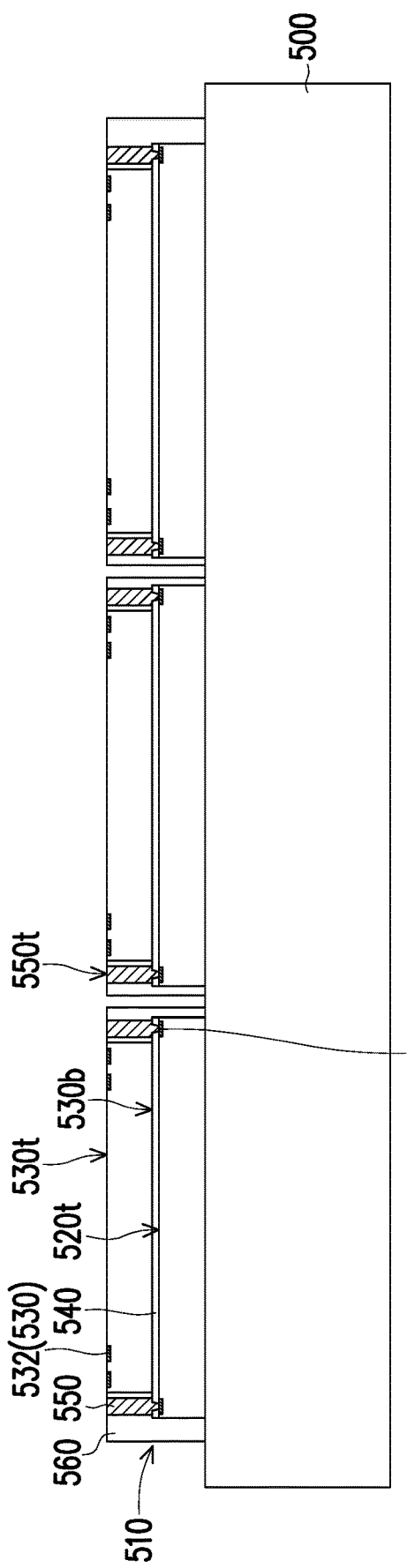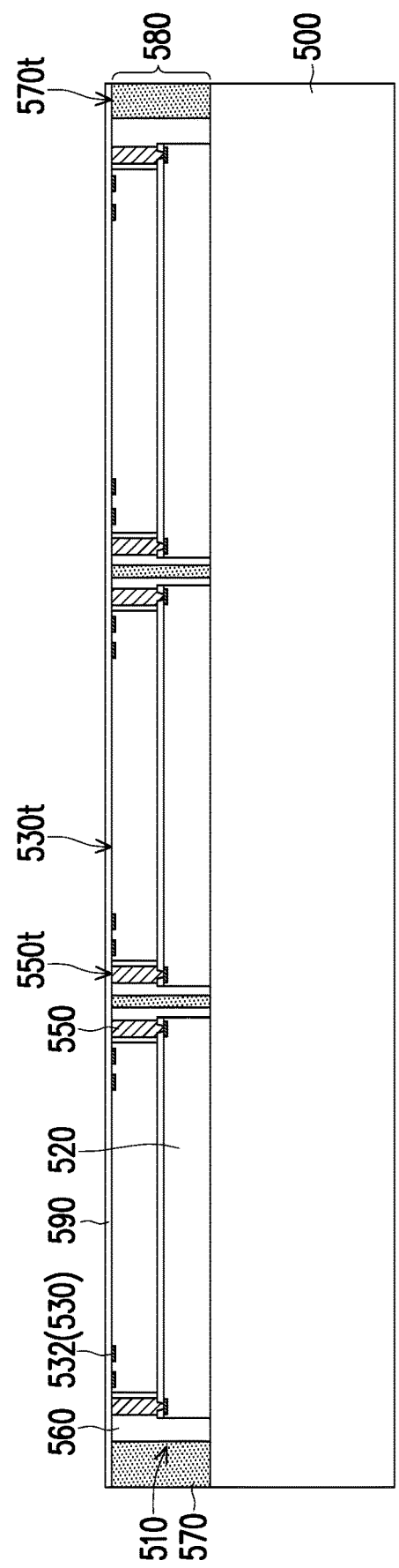
FIG. 4A
FIG. 4B

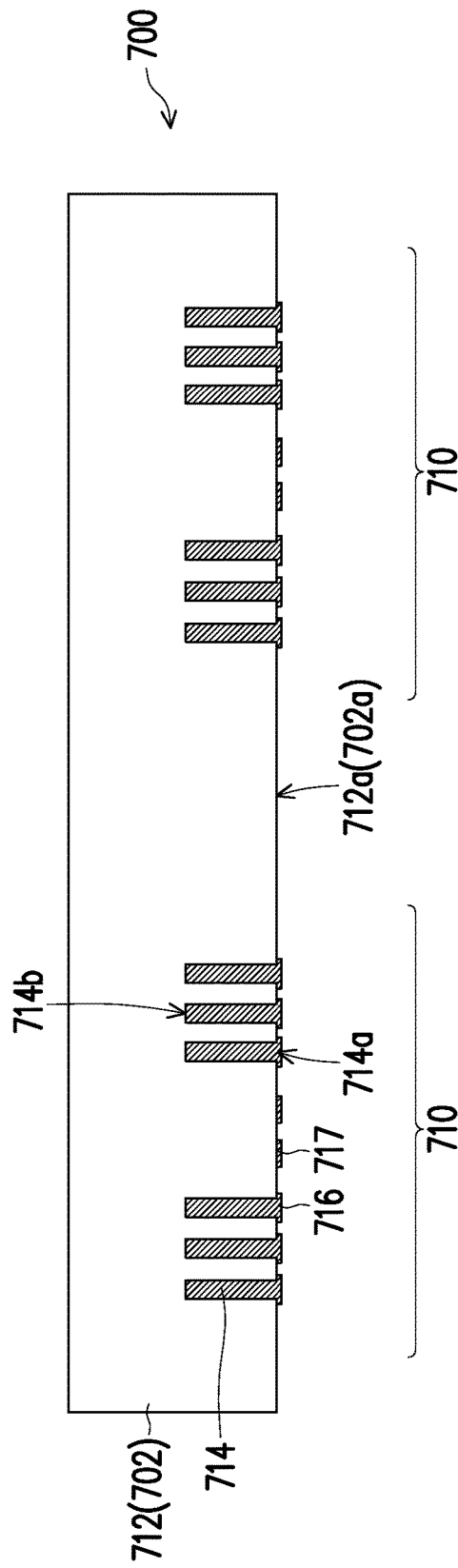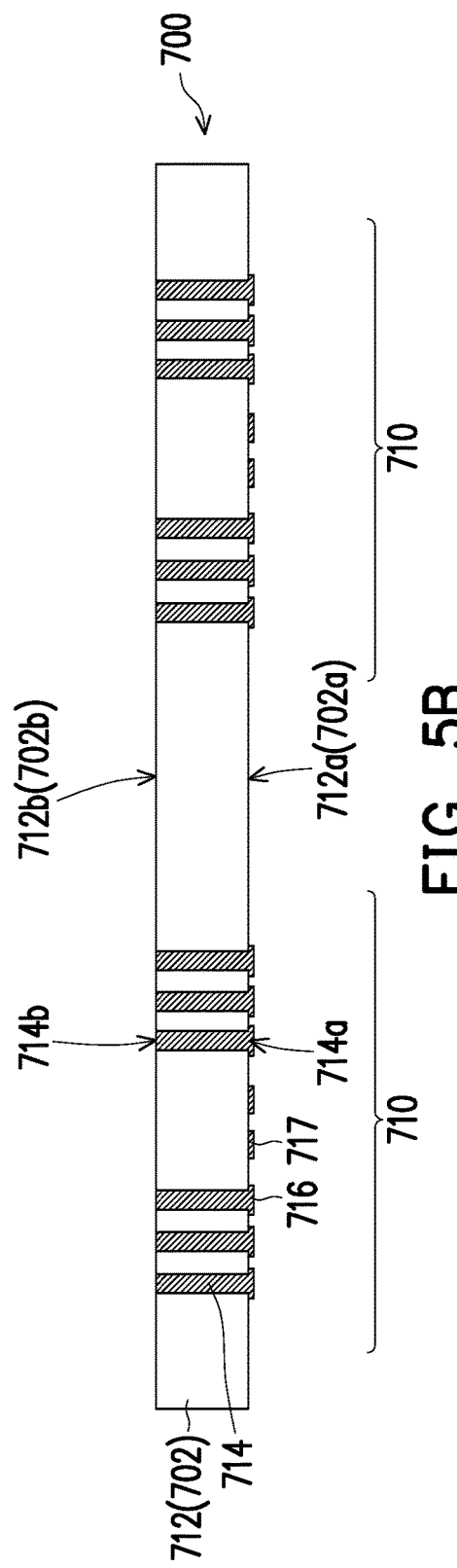

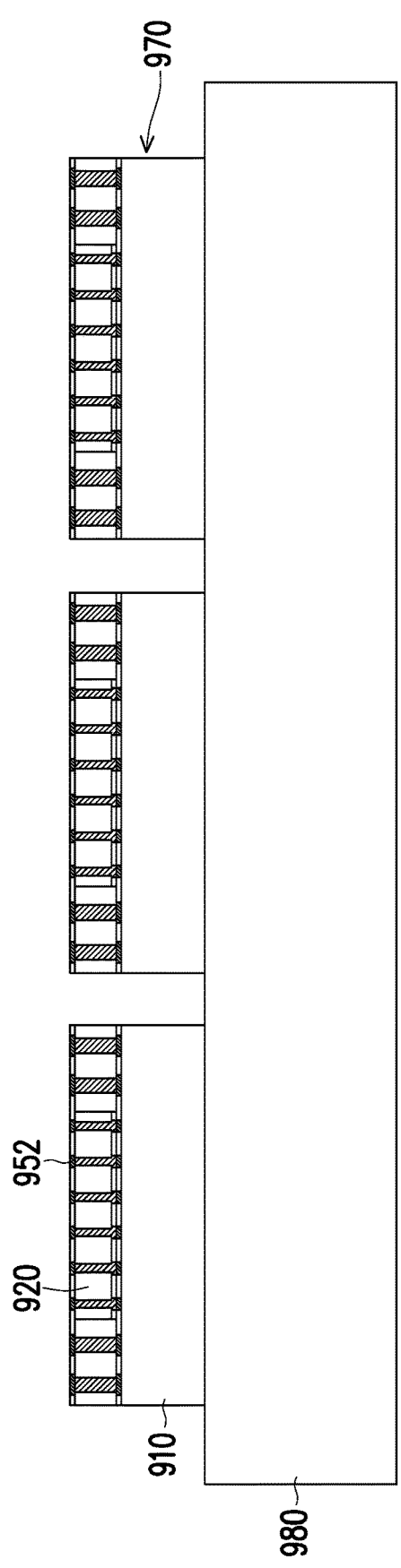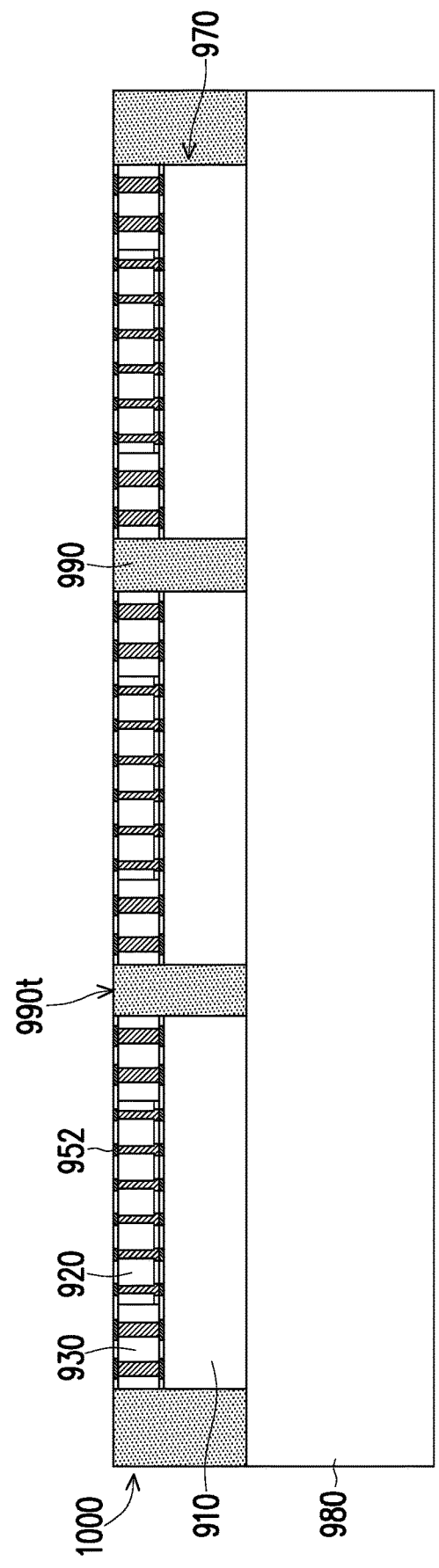

SEMICONDUCTOR PACKAGE AND MANUFACTURING METHOD THEREOF

BACKGROUND

Contemporary high performance computing systems consisting of one or more electronic devices are widely used in a variety of advanced electronic applications. When integrated circuit components or semiconductor chips are packaged for these applications, one or more chips are generally bonded to a circuit carrier (e.g., a system board, a printed circuit board, or the like) for electrical connections to other external devices or electronic components. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1F are schematic cross-sectional views of structures produced at various stages of a manufacturing method of a semiconductor package according to some embodiments of the present disclosure.

FIG. 3A through FIG. 3D are schematic cross-sectional views of structures produced at various stages of a manufacturing method of a semiconductor package according to some embodiments of the present disclosure.

FIG. 4A through FIG. 4D are schematic cross-sectional views of structures produced at various stages of a manufacturing method of a semiconductor package according to some embodiments of the present disclosure.

FIG. 5A through FIG. 5H are schematic cross-sectional views of structures produced at various stages of a manufacturing method of a semiconductor package according to some embodiments of the present disclosure.

FIG. 6A through FIG. 6E are schematic cross-sectional views of structures produced at various stages of a manufacturing method of a semiconductor package according to some embodiments of the present disclosure.

DETAILED DESCRIPTION

Figure 1C:
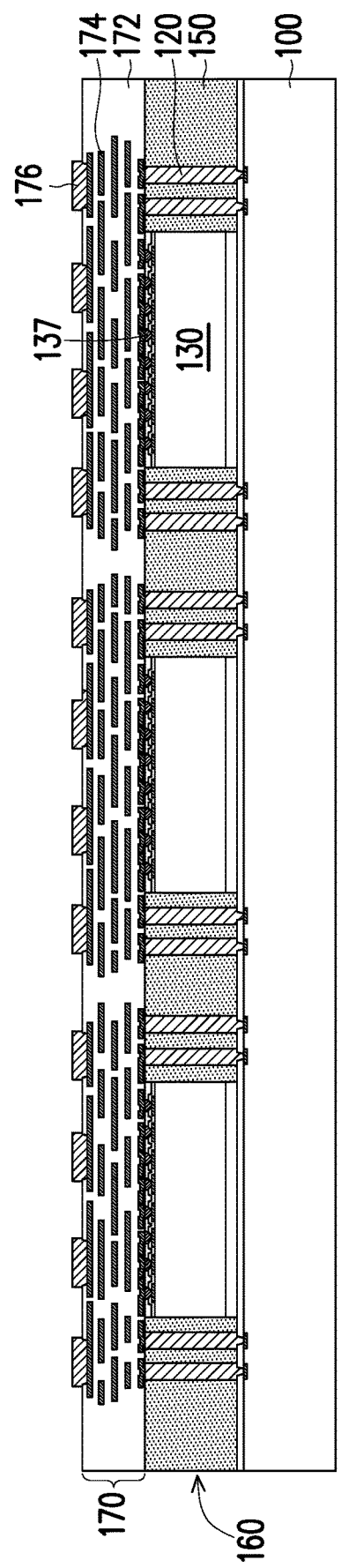

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1F are schematic cross-sectional views of structures produced at various stages of a manufacturing method of a semiconductor package 10 according to some embodiments of the present disclosure. Referring to FIG. 1A, a semiconductor wafer 100 is provided. In some embodiments, the semiconductor wafer 100 includes a semiconductor substrate 102 and contact pads 104 formed on a top surface 102t of the semiconductor substrate 102. In some embodiments, the top surface 102t of the semiconductor substrate 102 corresponds to a top surface 100t of the memory wafer 100. The semiconductor substrate 102 may be made of semiconductor materials, such as semiconductor materials of the groups III-V of the periodic table. In some embodiments, the semiconductor substrate 102 includes elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In certain embodiments, the contact pads 104 include aluminum pads, copper pads, or other suitable metal pads. In some embodiments, the material of the contact pads 104 include copper, copper alloys, or other conductive materials, and may be formed by deposition, plating, or other suitable techniques.

In some embodiments, the semiconductor substrate 102 includes active components (e.g., transistors or the like) and optionally passive components (e.g., resistors, capacitors, inductors, or the like) formed therein. In some embodiments, the components formed in the semiconductor substrate 102 are arranged so that one or more functional units are formed within the semiconductor wafer 100. For example, the semiconductor wafer 100 may be configured as a memory wafer, and individual regions thereof or the wafer as a whole may act as a dynamic random access memory (DRAM), a resistive random access memory (RRAM), a static random access memory (SRAM), a magnetoresistive random access memory (MRAM), a ferroelectric random access memory (FRAM), or the like. In some embodiments, the semiconductor wafer 100 includes at least one memory die.

In some embodiments, a passivation layer 110 is formed on the top surface 102t of the semiconductor substrate 102. In some embodiments, the passivation layer 110 covers the top surface 102t of the semiconductor substrate 102 and the contact pads 104. The passivation layer 110 may be a single layer or a multi-layered structure, and may include silicon oxide, silicon nitride, silicon oxy-nitride, other suitable dielectric materials or combinations thereof. The passivation layer 110 may be formed by suitable fabrication techniques such as spin-on coating, chemical vapor deposition (CVD), or the like.

Referring to FIG. 1B, in some embodiments the passivation layer 110 may be patterned to produce openings 112 exposing portions of the underlying contact pads 104, and a plurality of through insulator vias (TIVs) 120 are formed on the memory wafer 100. In some embodiments, the TIVs 120 are plated on the exposed portions of the contact pads 104. In some embodiments, the TIVs 120 may be formed as described below. First, a seed material layer (not shown) is formed over the passivation layer 110. In some embodiments, the seed material layer includes a titanium/copper composite layer and is formed by a sputtering process to conformally cover the passivation layer 110. The seed material layer may extend within the openings 112 to contact the exposed portions of the contact pads 104. Thereafter, a patterned auxiliary mask (not shown) with openings is formed on the seed material layer. The openings of the auxiliary mask expose the intended locations for the subsequently formed TIVs 120. For example, the openings of the auxiliary mask are formed in correspondence of the locations of the openings 112. Afterwards, a plating process is performed to form a metal material layer (e.g., a copper layer) on the seed material layer exposed by the openings of the auxiliary mask. Subsequently, the auxiliary mask and the seed material layer not covered by the metal material layer are removed, for example via a stripping process and an etching process, to form the TIVs 120. However, the disclosure is not limited thereto. In some alternative embodiments, other suitable methods may be utilized to form the TIVs 120. For example, pre-fabricated TIVs 120 (e.g., pre-fabricated copper pillars) may be picked-and-placed onto the passivation layer 110 in correspondence of the openings 112.

In some embodiments, semiconductor dies 130 are disposed side by side over memory wafer 100 with a pick-and-place process. In some embodiments, the semiconductor dies 130 are disposed in an array manner, for example a bi-dimensional array. However, the disclosure is not limited thereto, and other arrangements are possible according to routing requirements. It should be noted that while only three semiconductor dies 130 are shown in FIG. 1B, more then three semiconductor dies 130 may be disposed over the memory wafer 100, and when the semiconductor dies 130 are disposed in an array, a row of the array may include more than three semiconductor dies 130. In some embodiments, the semiconductor dies 130 include a semiconductor substrate 131, one or more contact pads 133, and a passivation layer 135. The contact pads 133 may be formed on a top surface 131t of the semiconductor substrate 131. The passivation layer 135 may cover the top surface 131t and have a plurality of openings that exposes at least a portion of each contact pad 133. In some embodiments, the semiconductor dies 130 further include a plurality of conductive posts 137 filling the openings of the passivation layer 135 and electrically connected to the contact pads 133, and a protective layer 139 surrounding the conductive posts 137. In some embodiments the protective layer 139 may completely cover the conductive posts 137 and (temporarily) constitute a top surface 130t of the semiconductor die 130. In some embodiments, the semiconductor dies 130 are placed over the memory wafer 100 with the top surfaces 131t of the semiconductor substrates 131 facing away from the memory wafer 100. Backside surfaces 130b of the semiconductor dies 130 opposite to the top surfaces 130t may be secured to the passivation layer 110 by portions of die attach film 140. In some embodiments, the die attach film 140 comprises a thermoplastic material, a thermocurable material, or a photocurable material. The die attach film 140 may comprise epoxy resins, phenol resins, polyolefins, or other suitable materials. However, the disclosure is not limited thereto, and other materials or polymers compatible with semiconductor processing environments may be used. The die attach film 140 may be applied via lamination, spin-coating, or other suitable techniques.

In some embodiments, the semiconductor dies 130 included in a semiconductor package have different sizes, or components of different sizes. For example, the semiconductor dies 130 may differ for the thickness of the semiconductor substrate 131, the number of contact pads 133, whether conductive posts 137 are included or not, and so on. Each semiconductor die 130 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, at least one of the semiconductor dies 130 is a logic die. In some embodiments, some of the semiconductor dies 130 may be memory dies.

Referring to FIG. 1B, an encapsulant 150 is formed over the memory wafer 100 to laterally encapsulate the semiconductor dies 130 and the TIVs 120. In some embodiments, as shown in FIG. 1B, the encapsulant 150 may extend all over the memory wafer 100. In some embodiments, the encapsulant 150 may be a molding compound, a molding underfill, a resin (such as an epoxy resin), or the like. In some embodiments, the encapsulant 150 is formed by an overmolding process. In some embodiments, the encapsulant 150 is formed by a compression molding process. In some embodiments, formation of the encapsulant 150 includes forming an encapsulating material (not shown) fully covering the semiconductor dies 130 and the TIVs 120, followed by removal of a portion of the encapsulating material by a planarization process until the TIVs 120 and the conductive posts 137 of the semiconductor dies 130 are exposed. In some embodiments, a portion of the protective layer 139 may be removed during the planarization process to expose the conductive posts 137. In some embodiments, the planarization of the encapsulating material includes performing a mechanical grinding process and/or a chemical mechanical polishing (CMP) process. In some embodiments, portions of the conductive posts 137 are removed during the planarization step. Following planarization, top surfaces 130t of the semiconductor dies 130 may be defined by the protective layers 139 and the conductive posts 137. That is, following the planarization step, the conductive posts 137 (or the contact pads 133) may be exposed and available for electrically connecting the semiconductor dies 130 to subsequently formed components or elements. In some embodiments, the top surfaces 130t of the semiconductor dies 130 exposing the conductive posts 137 (or the contact pads 133 if the conductive posts 137 are not included) are indicated as active surfaces. In some embodiments, the active surfaces 130t of the semiconductor dies 130 may be substantially coplanar with a top surface 150t of the encapsulant 150 and top surfaces 120t of the TIVs 120. In some embodiments, as shown in FIG. 1B, the encapsulant 130 fills the interstices between the semiconductor dies 130 and the TIVs 120. In some embodiments, with formation of the encapsulant 150 is obtained a reconstructed wafer 160. In some embodiments, the reconstructed wafer 160 includes the semiconductor dies 130 encapsulated by the encapsulant 150 and the memory wafer 100.

Referring to FIG. 1C, in some embodiments a redistribution structure 170 is formed over the TIVs 120, the semiconductor dies 130 and the encapsulant 150, on an exposed surface of the reconstructed wafer 160. In some embodiments, the redistribution structure 170 includes a dielectric layer 172, a redistribution conductive layer 174, and a plurality of under-bump metallurgies 176. For simplicity, the dielectric layer 172 is illustrated as a single dielectric layer and the redistribution conductive layer 174 is illustrated as embedded in the dielectric layer 172. Nevertheless, from the perspective of the manufacturing process, the dielectric layer 172 is constituted by at least two dielectric layers and the redistribution conductive patterns of the redistribution conductive layer 174 are sandwiched between the two adjacent dielectric layers. The redistribution conductive layer 174 may be constituted by a plurality of redistribution conductive patterns. Some of the redistribution conductive patterns may extend vertically through the dielectric layer 172 to establish electrical connection between different height levels of the redistribution structure 170. In some embodiments, the (outermost) dielectric layer 172 may be patterned to expose the underlying patterns of the redistribution conductive layer 174. The under-bump metallurgies 176 may optionally be conformally formed in the openings exposing the redistribution conductive layer 174, and may further extend over portions of the exposed (outermost) surface of the dielectric layer 172. In some embodiments, the under-bump metallurgies 176 include multiple stacked layers. For example, the under-bump metallurgies 176 may include one or more metallic layers stacked on a seed layer.

In some embodiments, materials of the redistribution conductive layer 174 and the under-bump metallurgies 176 include aluminum, titanium, copper, nickel, tungsten, or alloys thereof. The redistribution conductive layer 174 and the under-bump metallurgies 176 may be formed by, for example, electroplating, deposition, and/or photolithography and etching. In some embodiments, the material of the dielectric layer 172 includes polyimide, epoxy resin, acrylic resin, phenol resin, benzocyclobutene (BCB), polybenzoxazole (PBO), or any other suitable polymer-based dielectric material. The dielectric layer 172, for example, may be formed by suitable fabrication techniques such as spin-on coating, chemical vapor deposition (CVD), plasma-enhanced chemical vapor deposition (PECVD), or the like. It should be noted that the number of the redistribution conductive layers 174 and the number of the dielectric layers 172 illustrated in FIG. 1A are merely for illustrative purposes, and the disclosure is not limited thereto. In some alternative embodiments, more layers of the redistribution conductive layer 174 and more layers of the dielectric layer 172 may be formed depending on the circuit design. When more layers of the redistribution conductive layer 174 and more layers of the dielectric layer 172 are required, the layers of the redistribution conductive layers 174 are still stacked alternately with the layers of the dielectric layer 172.

Figure 1D:
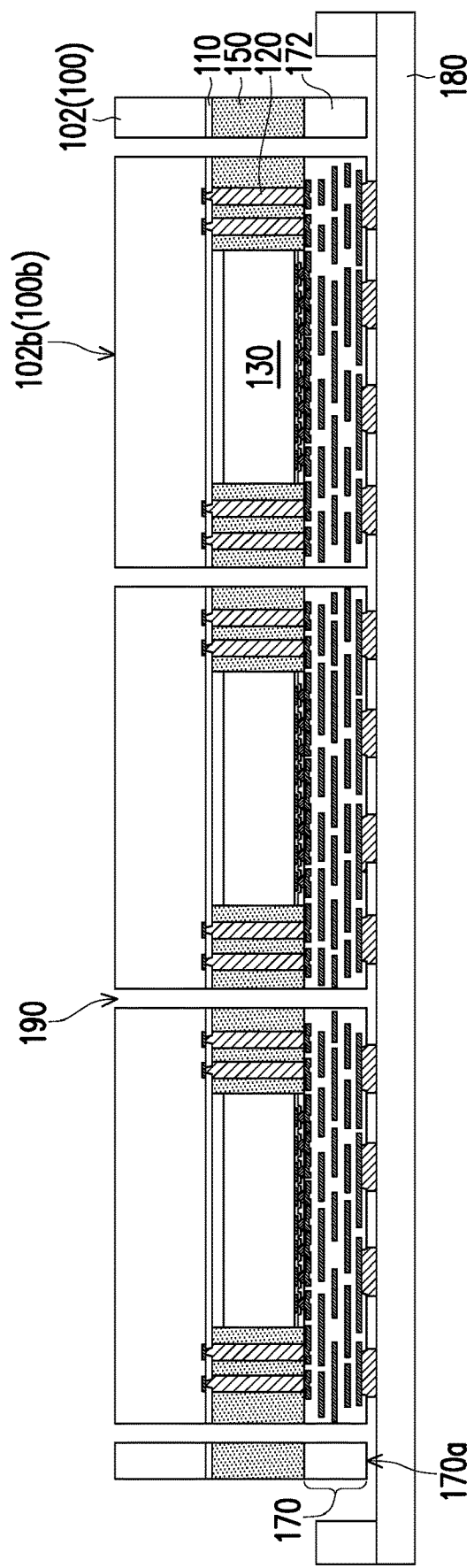
Figure 1E:
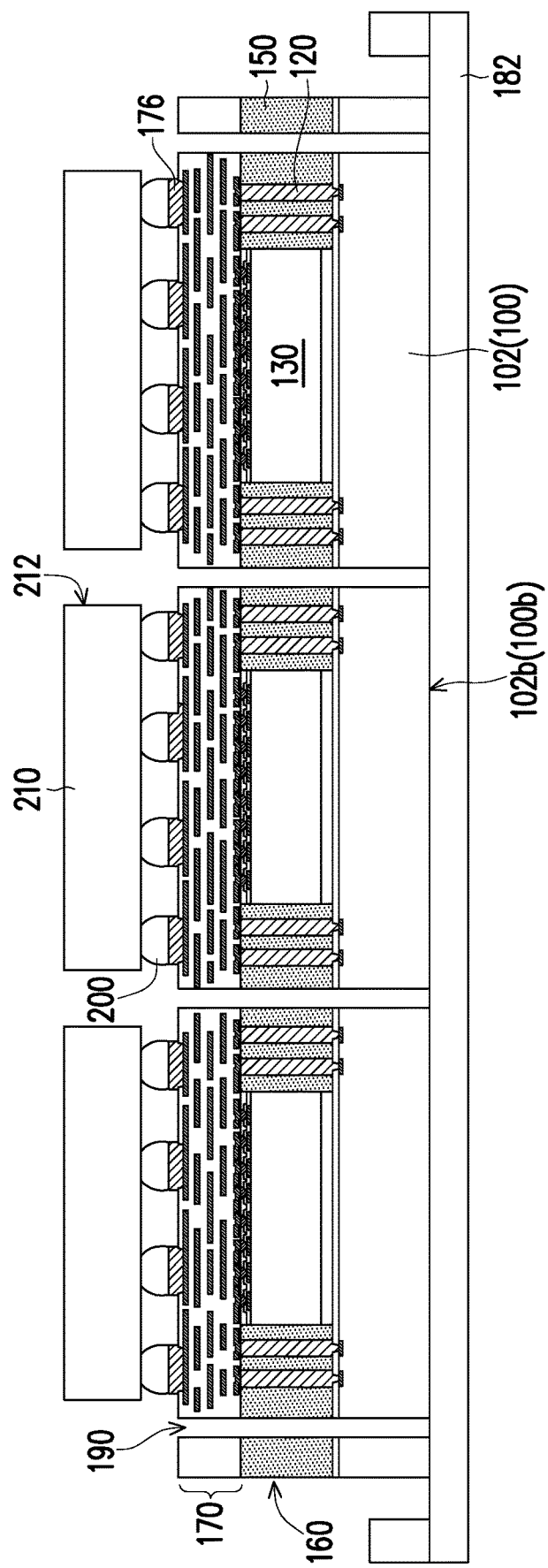

Referring to FIG. 1C and FIG. 1D, the reconstructed wafer 160 may be overturned over a supporting frame 180 to continue the manufacturing process. In some embodiments, the surface of the redistribution structure 170 where the under-bump metallurgies 176 have been formed is disposed closer to the frame 180 and the backside surface 100b of the memory wafer 100 may be exposed for further processing. In some embodiments, the surface of the redistribution structure 170 closer to the frame 180 may be embedded in a protective tape (not shown). In some embodiments, screw holes 190 are opened throughout the reconstructed wafer 160. That is, the screw holes 190 may extend through the semiconductor substrate 102, the passivation layer 110, the encapsulant 150, and the dielectric layer 172. In some embodiments, the screw holes 190 are opened by laser drilling from the side of the memory wafer 100. Referring to FIG. 1D and FIG. 1E, the reconstructed wafer 160 may be overturned over a supporting frame 182 to expose the redistribution structure 170 for further processing. If the redistribution structure 170 was embedded in a protective tape, said protective tape is removed after mounting the reconstructed wafer 160 on the supporting frame 182. Referring to FIG. 1E, in some embodiments, a socket 210 may be connected to the redistributions structure 170 through connectors 200. In some embodiments, the socket 210 includes conductive patterns (not shown) interconnecting the surface contacted by the connectors 200 with the opposite surface (the surface further away from the reconstructed wafer 160). The connectors 200 may include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e.g., a metal pillar with a solder ball attached), or the like. The connectors 200 may be electrically connected to the memory wafer 100, the TIVs 120 and the semiconductor dies 130 via the redistribution structure 170. In some embodiments, the connectors 200 are formed on the socket 210 before connecting the socket 210 to the reconstructed wafer 160. In some alternative embodiments, the connectors 200 may be formed on the under-bump metallurgies 176 before overturning the reconstructed wafer 160 on the supporting frame 180 (shown in FIG. 1D). In some embodiments, the socket 210 may be a wafer-size socket including openings 212 aligned with the screw holes 190. In some alternative embodiments, multiple sockets 210 may be disposed on the reconstructed wafer 160 in correspondence of the dies 130. Gaps in between adjacent sockets may be aligned with the screw holes 190, in a similar fashion as shown for the openings 212 of the wafer-size socket illustrated in FIG. 1E. In some embodiments, each die 130 is connected to a corresponding individual socket 210.

Figure 1F:
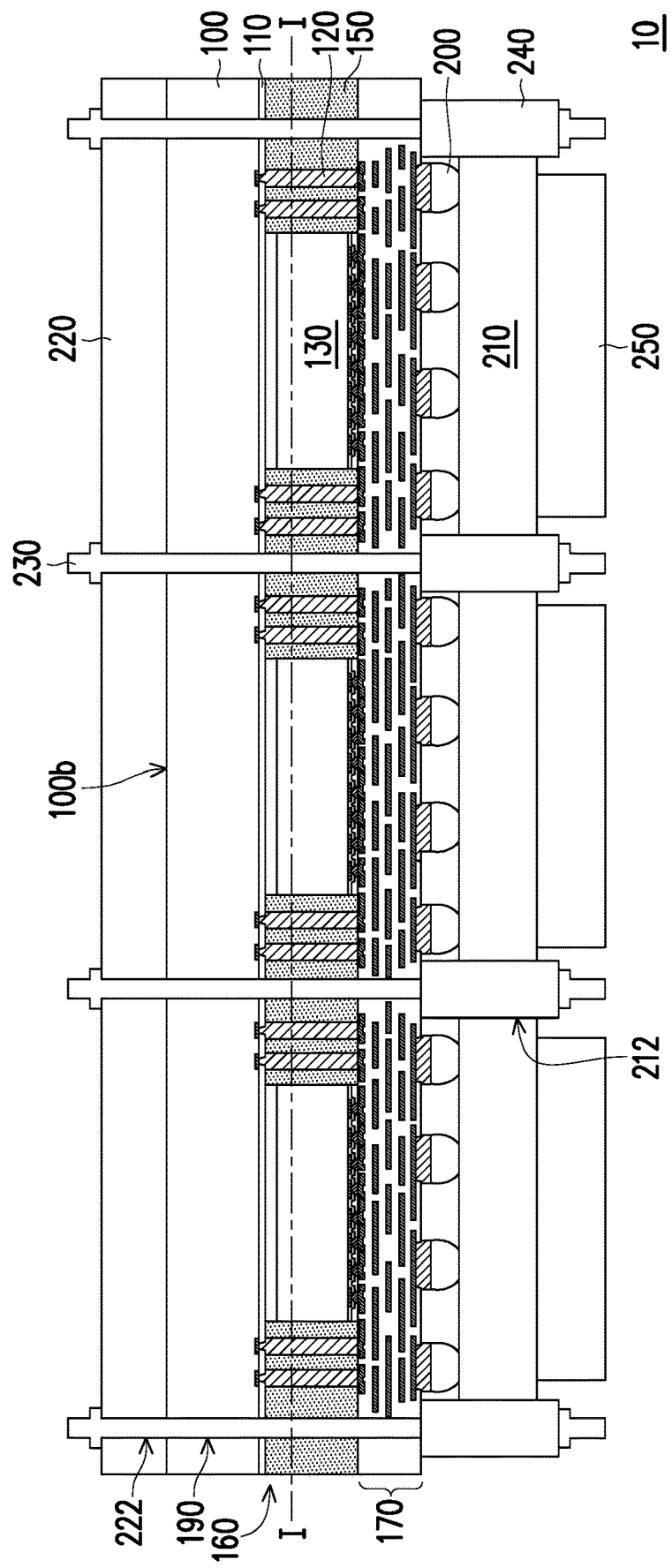

Referring to FIG. 1E and FIG. 1F, in some embodiments the supporting frame 182 may be removed, and a heat sink 220 may be secured on the reconstructed wafer 160 on the side of the memory wafer 100. In some embodiments, the heat sink 220 includes a metal plate with holes 222 formed therein. In some embodiments, the holes 222 are aligned with the screw holes 190. In some embodiments, the holes 222 may be opened in the metal plate by mechanical drilling. In some embodiments, the heat sink 220 is secured to the reconstructed wafer 160 via screws or bolts 230 and nuts 240. The screws 230 may fill the screw holes 190 and the holes 222 of the heat sink 220, and be received by nuts 240 disposed on the reconstructed wafer 160 on the side of the redistribution structure 170. In some embodiments, the screws 230 cross through the heat sink 220 and the reconstructed wafer 160. In some embodiments, the screws 230 further cross the socket 210 through the openings 212. In some embodiments, the nuts 240 may be disposed in the openings 212 of the socket 210. In some embodiments, power modules 250 may be connected to the socket 210 on an opposite side of the reconstructed wafer 160. In some embodiments, the reconstructed wafer 160 is incorporated into the finished semiconductor package 10, without being singulated.

In FIG. 1F is shown a cross-sectional view of the semiconductor package 10 according to some embodiments of the disclosure. Based on the above, the semiconductor package 10 includes semiconductor dies 130 disposed on the redistribution structure 170, and encapsulated by the encapsulant 150. In some embodiments, the memory wafer 100 is a semiconductor wafer having one or more memory devices formed therein. The memory wafer 100 is vertically stacked on the semiconductor dies 130 and the redistribution structure 170, and is connected to the semiconductor dies 130 via the TIVs 120 and the redistribution structure 170. In some embodiments, the semiconductor dies 130 are disposed between the memory wafer 100 and the redistribution structure 170. In some embodiments, at least some of the semiconductor dies 130 are logic dies which are connected to memory devices formed in the memory wafer 100. The heat sink 220 may be disposed on the memory wafer 100, and the memory wafer 100 may be interposed between the heat sink 220 and the semiconductor dies 130. In some embodiments, the heat sink 220 may be secured to the memory wafer 100 and the redistribution structure 170 via screws 230 extending through the heat sink 220, the memory wafer 100, the encapsulant 150 and the redistribution structure 170. In some embodiments, the memory wafer 100 and the redistribution structure 170 present areas devoid of devices or conductive traces surroundings the screws 230. In some embodiments, the redistribution structure 170 may connect the semiconductor dies 130 and the memory wafer 100 to a socket 210, and the socket 210 may have power modules 250 disposed on an opposite side with respect to the redistribution structure 170. However, the disclosure is not limited thereto. In some embodiments, the socket 210 and the power modules 250 may be omitted. Similarly, in some embodiments the heat sink 220 may be omitted, or it may be secured to the reconstructed wafer 160 through other ways than via screws 230 and nuts 240 (e.g., via other fasteners such as clamps, glued, etc.). In some embodiments, by vertically stacking the memory dies with the logic dies, it may be possible to increase the memory capacity of a semiconductor package without increasing the horizontal footprint. In some embodiments, greater design flexibility can also be achieved and more space for die-to-die interconnection may be available. Furthermore, the distance between a memory die and an associated logic die may be reduced.

Figure 2A:
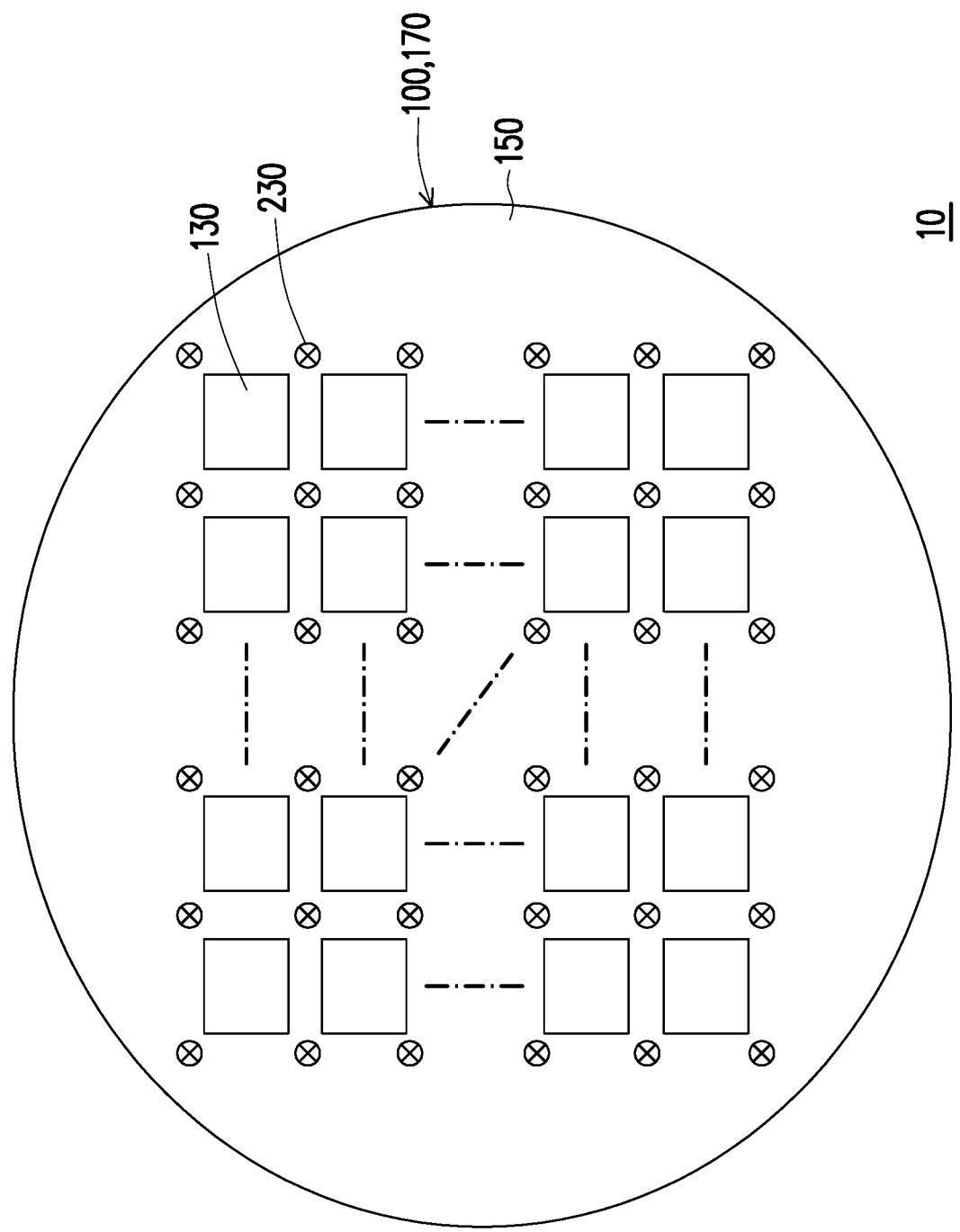
FIG. 2A is a schematic cross-sectional view of a semiconductor package according to some embodiments of the present disclosure.
Figure 2B:
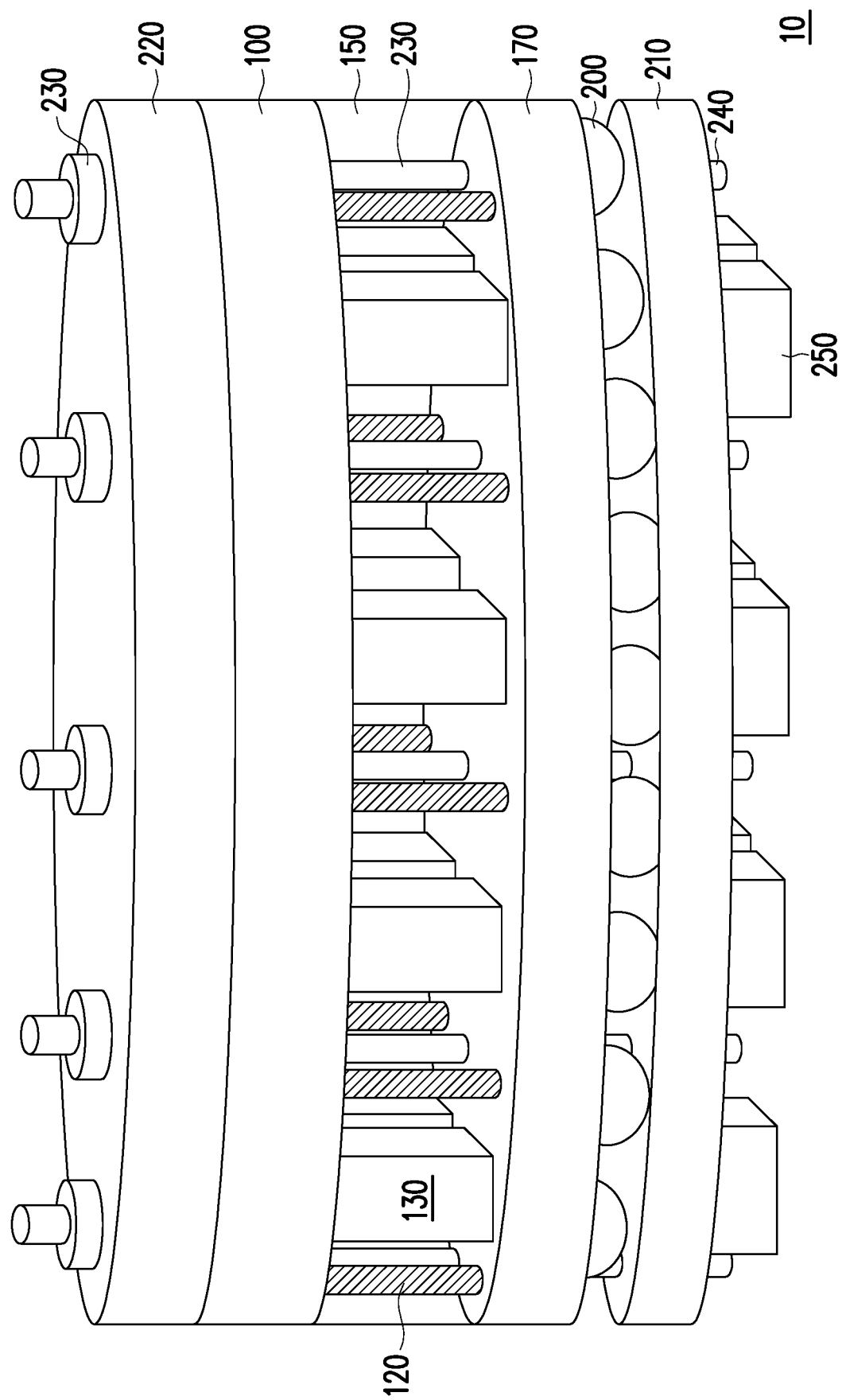
FIG. 2B is a schematic three dimensional view of a semiconductor package according to some embodiments of the present disclosure.

In FIG. 2A is shown a schematic cross-sectional view of the semiconductor package 10 according to some embodiments of the disclosure. In FIG. 2B is shown a schematic three-dimensional view of the semiconductor package 10 according to some embodiments of the disclosure. The schematic cross-sectional view of FIG. 2A may be taken at the level height I-I of FIG. 1F. For the sake of simplicity, only some elements are shown in the views of FIG. 2A and FIG. 2B. For example, in FIG. 2A only some semiconductor dies 130 and some of the screws 230 are illustrated, while the TIVs 120 are omitted. In some embodiments, the semiconductor package is a large scale package (a wafer-size package). In some embodiments, an area (a footprint) of the semiconductor package 10 may be in the range from 1000 to 300000 mm$^2$ (e.g., a 12 inches wafer). In some embodiments, the semiconductor package 10 may have a rectangular shape, a square shape, or a circular shape. In some embodiments, the semiconductor package 10 may have a multi-layered structure, in which the redistributions structure 170, the encapsulant 150 with the semiconductor dies 130 and the TIVs 120, and the memory wafer 100 correspond to different layers vertically stacked. In some embodiments, the area (the footprint) of the redistribution structure 170 substantially matches (corresponds in shape and size with) the span of the encapsulant 150 and the memory wafer 100. In some embodiments, the area (footprint) of the heat sink 220 also matches the footprint of the memory wafer 100. In some embodiments, the TIVs 120 may form one or more rings surrounding one or more semiconductor dies 130. However, the disclosure is not limited thereto. The relative positions and the number of the various elements (e.g., the TIVs 120, the semiconductor dies 130, the screws 230) shown in FIG. 2A and FIG. 2B are only for illustration purpose and each may be independently adapted according to the design requirements.

Figure 2C:
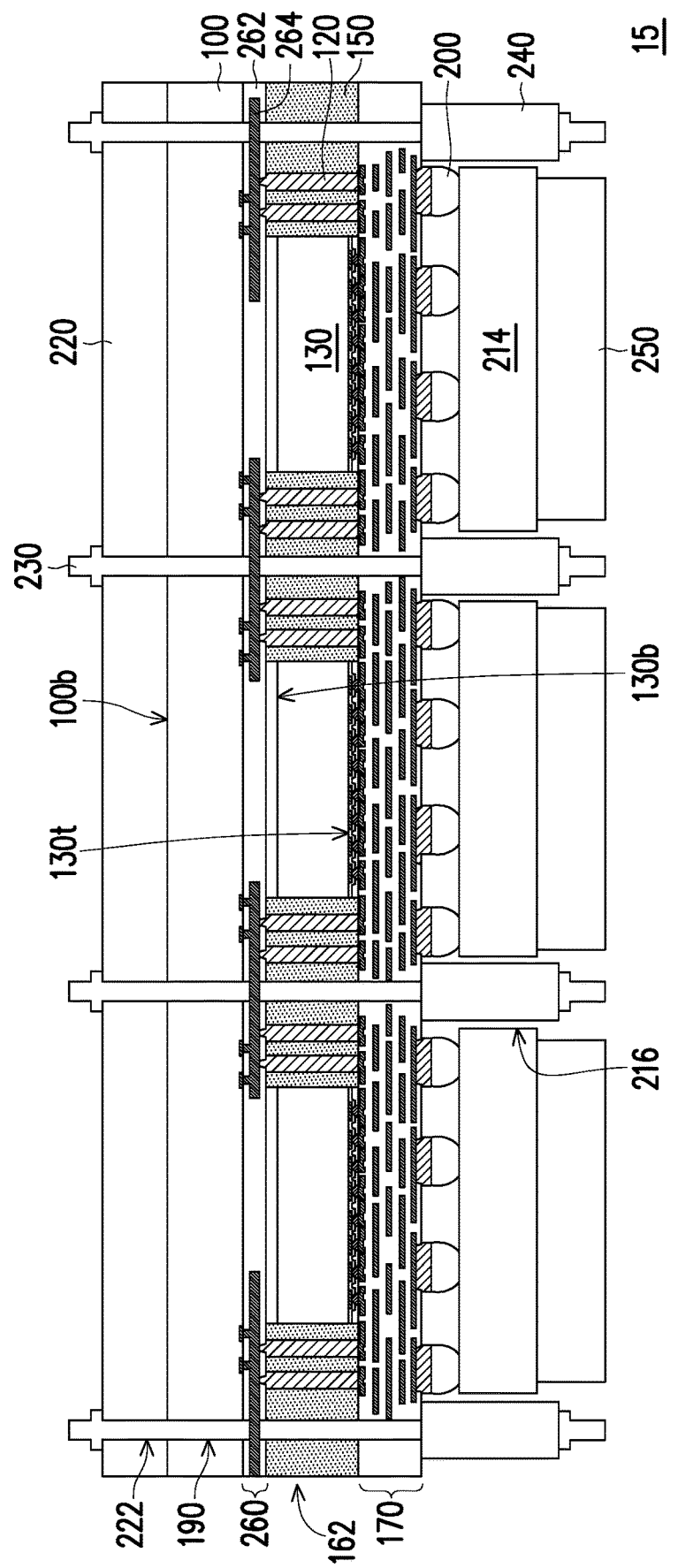
FIG. 2C is a schematic cross-sectional view of a semiconductor package according to some embodiments of the present disclosure.

FIG. 2C is a schematic cross-sectional view of a semiconductor package 15 according to some embodiments of the disclosure. Briefly, the semiconductor package 15 includes the reconstructed wafer 162 which includes the memory wafer 100, the encapsulated semiconductor dies 130 and TIVs 120, and a redistribution structure 260. That is, in the semiconductor package 15, the redistribution structure 260 is formed on the top surface 100$t$ of the memory wafer 100 before forming the TIVs 120 or providing the semiconductor dies 130. The redistribution structure 260 may include dielectric layer(s) 262 and redistribution conductive patterns 264 providing electrical connection between the memory wafer 100 and the TIVs 120. In some embodiments, the redistribution structure 260 connects a semiconductor die 130 to a nearby memory die formed in the memory wafer 100. In some embodiments, the redistribution structure 260 may also interconnect nearby memory dies formed in the memory wafer 100. In some embodiments, the semiconductor dies 130 are disposed on the redistribution structure 260 with active surfaces 130$t$ directed towards the redistribution structure 170 and backside surfaces 130$b$ facing the redistribution structure 260. In some embodiments, multiple sockets 214 are connected to the redistribution structure 170 in correspondence of the semiconductor dies 130. In some embodiments, the nuts 240 are disposed in the gaps 216 between the sockets 214 to receive the screws 230. In some embodiments, the screws 230 extend through the dielectric layer(s) 262 of the redistribution structure 260 without contacting the redistribution conductive patterns 264.

Figure 3C:
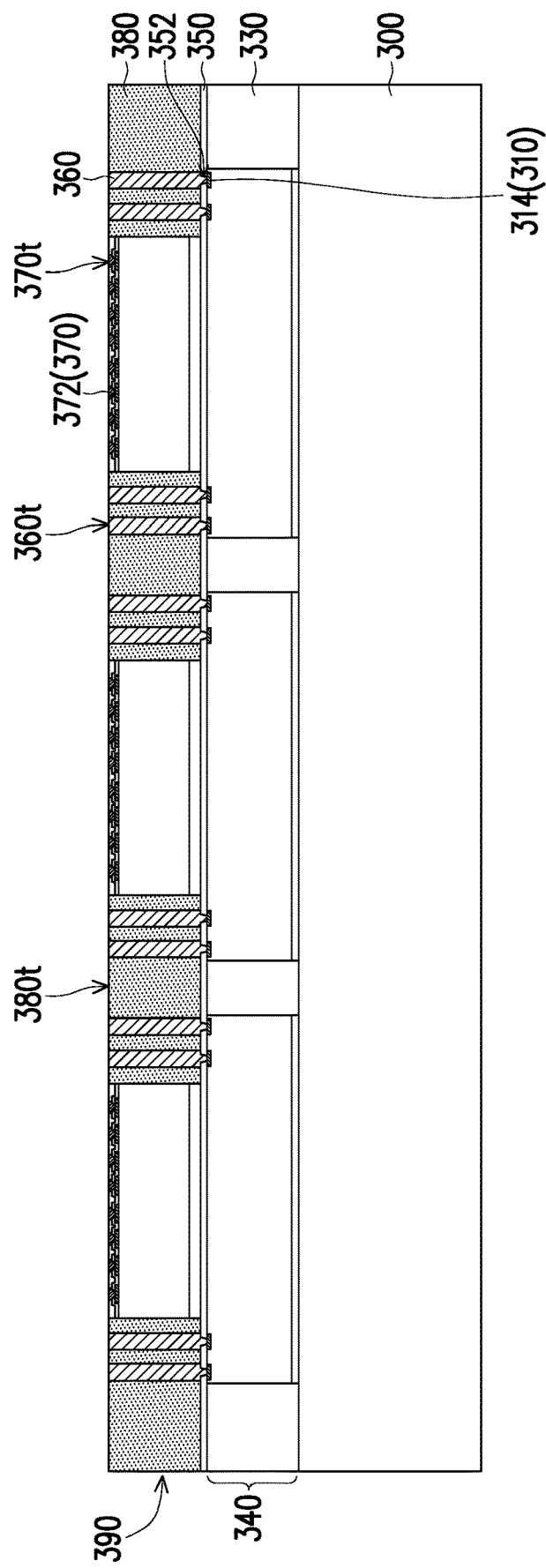

FIG. 3A to FIG. 3D are schematic cross-sectional views of structures produced at various stages of a manufacturing method of a semiconductor package 20 according to some embodiments of the present disclosure. Referring to FIG. 3A, a carrier 300 is provided. In some embodiments, the carrier 300 is a glass substrate, a metal plate, a plastic supporting board or the like, but other suitable substrate materials may be used as long as the materials are able to withstand the subsequent steps of the process. In some embodiments, a de-bonding layer (not shown) is provided on the carrier 300 to facilitate peeling the carrier 300 away from the structure when required by the manufacturing process. In some embodiments, the de-bonding layer includes a light-to-heat conversion (LTHC) release layer. In some embodiments, semiconductor dies 310 are disposed on the carrier 300. The semiconductor dies 310 may be disposed with an active surface 310t facing away from the carrier 300. The active surface 310t may correspond to the top surface 312t of the semiconductor substrate 312, on which contact pads 314 are formed. In some embodiments, the semiconductor dies 310 may be secured to the carrier 300 via portions of die attach film 320 disposed on the backside surfaces 310b. In some embodiments the semiconductor dies 310 are memory dies.

Referring to FIG. 3B, in some embodiments, an encapsulant 330 is formed on the carrier 300 to laterally encapsulate the semiconductor dies 310. In some embodiments, the encapsulant 330 may include a similar material and be fabricated via a similar process to the one described above for the encapsulant 150, and a detailed description thereof is omitted herein. In some embodiments, formation of the encapsulant 330 includes a planarization process, after which the top surfaces 310t of the semiconductor dies 310 and the top surface 330t of the encapsulant 330 are substantially at a same level height. Following the planarization process, the contact pads 314 of the semiconductor dies 310 are not covered by the encapsulant 330. In some embodiments, formation of the encapsulant 330 results in a reconstructed wafer 340. In some embodiments, the semiconductor dies 310 are memory dies, and the reconstructed wafer 340 is referred to as a memory wafer. The memory wafer 340 may be used in place of the memory wafer 100 (shown in FIG. 1A) to produce a wafer-size semiconductor package according to some embodiments of the disclosure, following a similar process as discussed above with reference to FIG. 1B to FIG. 1F. For example, a passivation layer 350 may be formed on the memory wafer 340, covering the encapsulant 330 and the semiconductor dies 310. Referring to FIG. 3C, openings 352 may be formed in the passivation layer 350 to expose the contact pads 314 of the semiconductor dies 310. TIVs 360 may be formed over the memory wafer 340, filling the openings 352 to be electrically connected to the semiconductor dies 310. Semiconductor dies 370 may be disposed on the passivation layer 350 beside the TIVs 360. The semiconductor dies 370 may be disposed in a face-up configuration, with an active surface 370t exposing conductive posts (or contact pads) 372 facing away from the memory wafer 340. In some embodiments, the semiconductor dies 370 are logic dies. An encapsulant 380 may be provided to wrap the semiconductor dies 370 and the TIVs 360. A top surface 380t of the encapsulant 380 may be substantially at the same level height as the top surfaces 360t of the TIVs 360 and the top surfaces 370t of the semiconductor dies 370. With the formation of the encapsulant 380, a reconstructed wafer 390 may be formed. The reconstructed wafer 390 may include the memory wafer 340 and the encapsulated semiconductor dies 370.

Figure 3D:
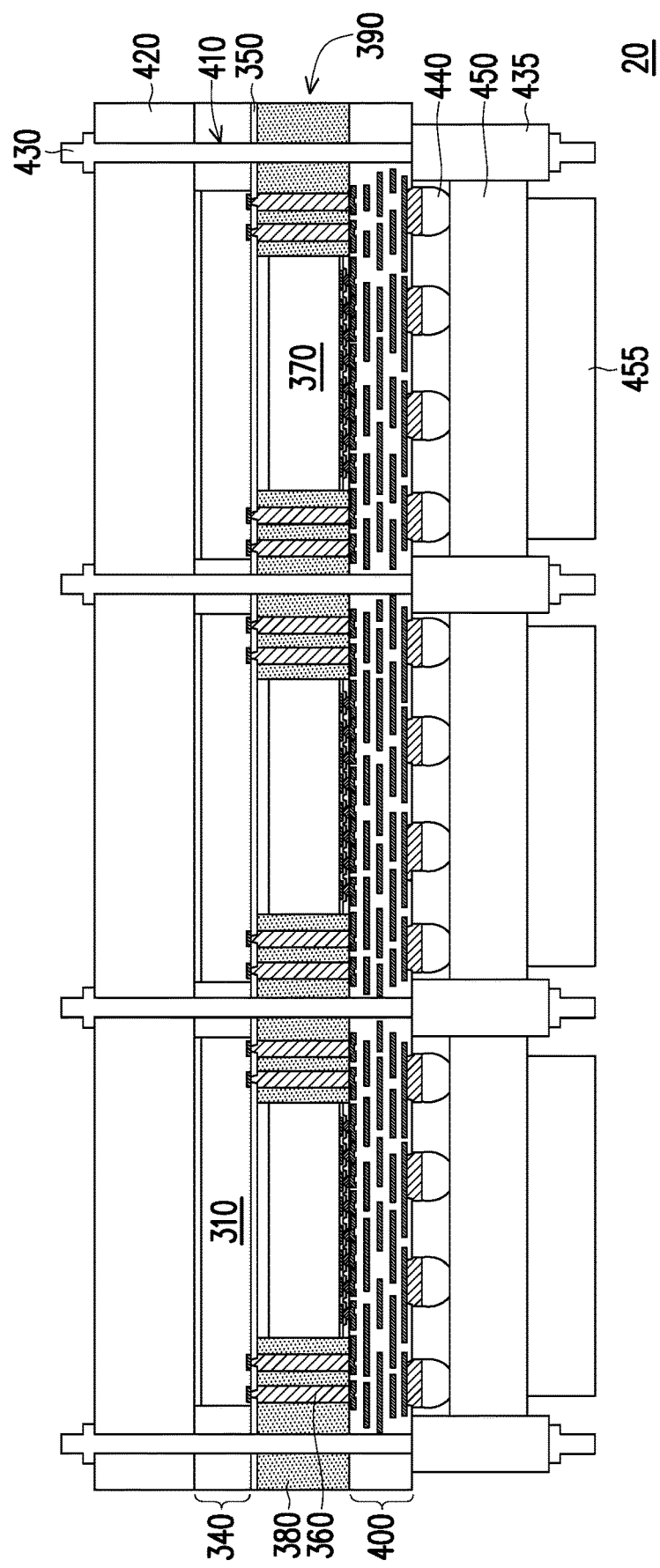

In some embodiments, the reconstructed wafer 390 may undergo similar process steps to the ones discussed above with references to FIG. 1C to FIG. 1F for the reconstructed wafer 160 to produce a semiconductor package 20 (shown in FIG. 3D). Namely, a redistribution structure 400 may be formed on the reconstructed wafer 390 on top of the encapsulant 380 and the semiconductor dies 370. The redistribution structure 400 may interconnect the semiconductor dies 370 to the semiconductor dies 310 in the memory wafer 340 through the TIVs 360. In the semiconductor package 10, the semiconductor dies 310 included in the memory wafer 340 may be vertically stacked with the semiconductor dies 370, with the semiconductor dies 370 disposed between the semiconductor dies 310 and the redistribution structure 400. Subsequently, screw holes 410 may be formed through the reconstructed wafer 390. A heat sink 420 may be connected to the reconstructed wafer 390 on the side of the memory wafer 340. The heat sink 420 may be secured with screws (or bolts) 430 and nuts 435 to the reconstructed wafer 390, with the screws 430 running through the screw holes 410. Connectors 440 may be formed on a surface of the redistribution structure 400 further away from the reconstructed wafer 390. A socket 450 having power module(s) 455 disposed on top may be connected to the redistribution structure 400 via the connectors 440. In some embodiments, the reconstructed wafer 390 is incorporated in the semiconductor package 20 without being singulated. In some embodiments, the carrier 300 (shown in FIG. 3C) may be removed at a certain point during the manufacturing process. For example, the carrier 300 may be removed after formation of the redistribution structure 400 or the connectors 440.

Figure 3E:
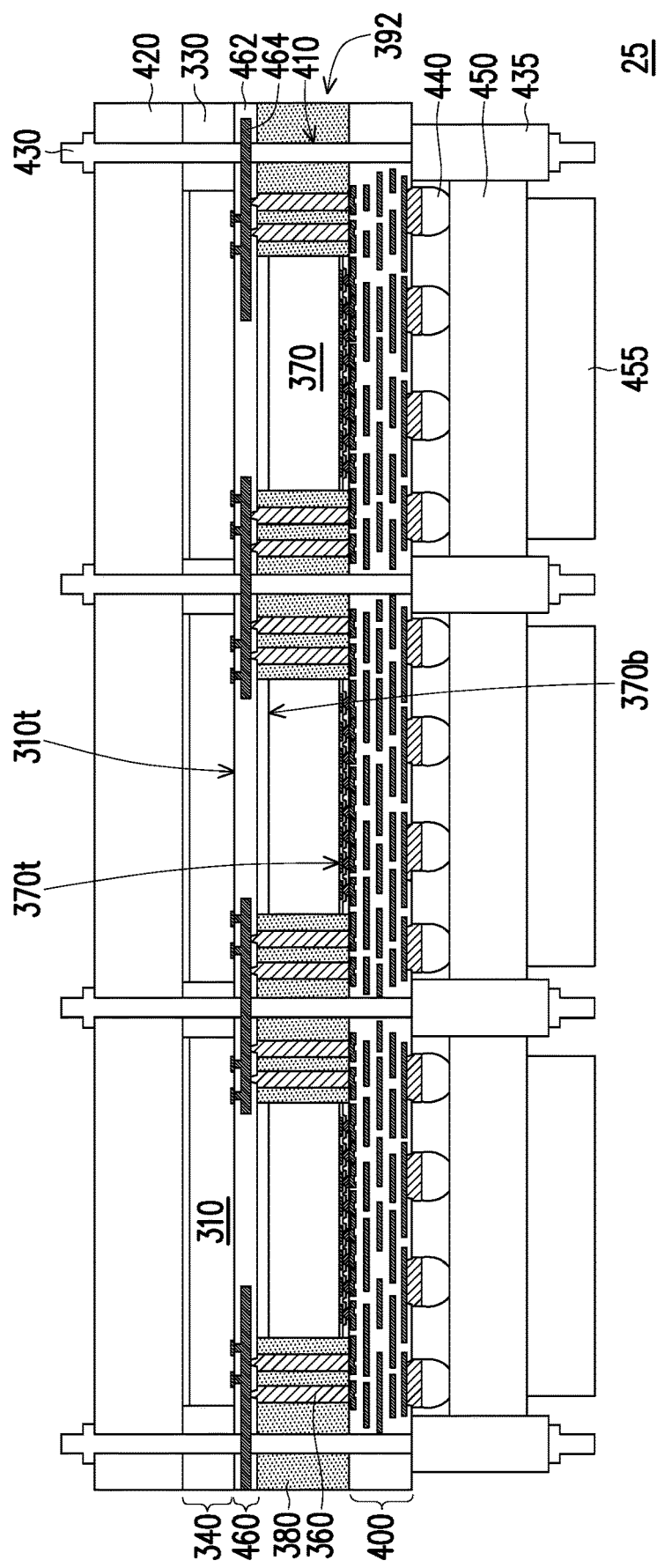
FIG. 3E is a schematic cross-sectional view of a semiconductor package according to some embodiments of the present disclosure.

FIG. 3E is a schematic cross-sectional view of a semiconductor package 25 according to some embodiments of the disclosure. Briefly, the semiconductor package 25 includes the reconstructed wafer 392 which includes the memory wafer 340, the encapsulated semiconductor dies 370 and TIVs 360, and a redistribution structure 460. That is, in the semiconductor package 25, the redistribution structure 460 is formed on the encapsulant 330 and the top surfaces 310t of the semiconductor dies 310 of the memory wafer 340 before forming the TIVs 360 or providing the semiconductor dies 370. The redistribution structure 460 may include dielectric layer(s) 462 and redistribution conductive patterns 464 providing electrical connection between the memory wafer 340 and the TIVs 360. In some embodiments, the redistribution structure 460 connects a semiconductor die 370 to a nearby semiconductor die 310 encapsulated in the memory wafer 340. In some embodiments, the redistribution structure 460 may also interconnect nearby semiconductor dies 310 of the memory wafer 340. In some embodiments, the semiconductor dies 370 are disposed on the redistribution structure 460 with active surfaces 370t directed towards the redistribution structure 400 and backside surfaces 370b facing the redistribution structure 460.

Figure 4C:
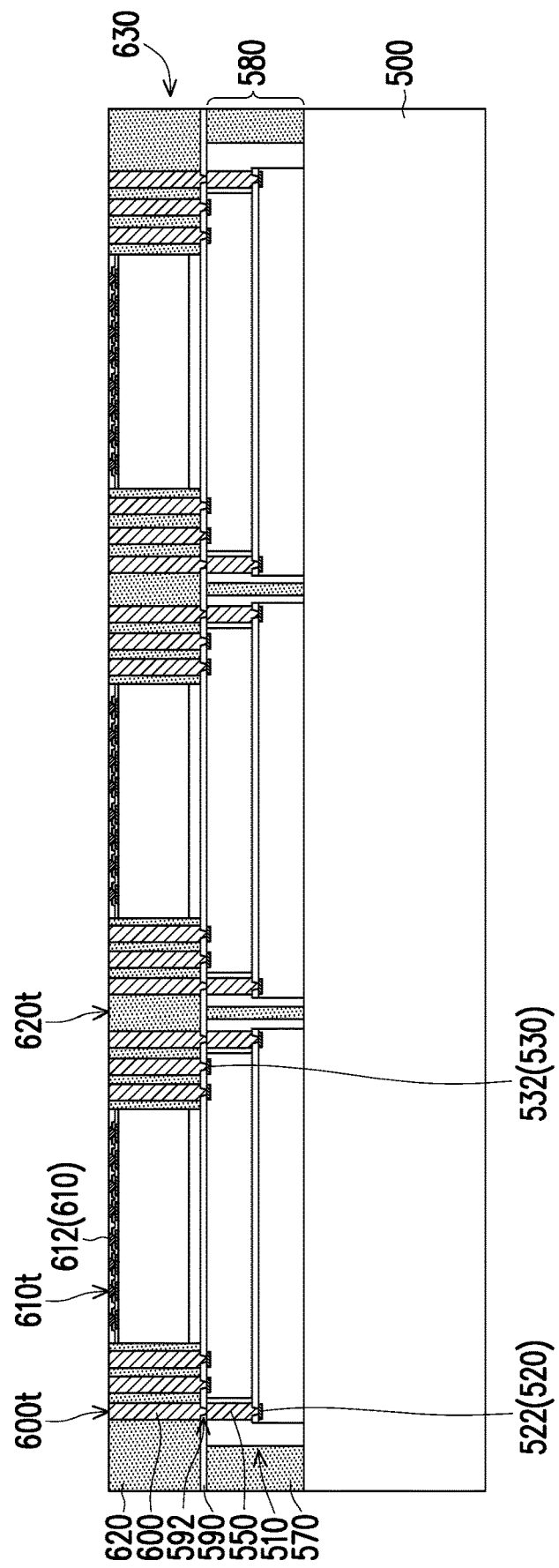

FIG. 4A to FIG. 4D are schematic cross-sectional views of structures produced at various stages of a manufacturing method of a semiconductor package 30 according to some embodiments of the present disclosure. Referring to FIG. 4A, a carrier 500 is provided. The carrier 500 may be similar to the carrier 300, and a detailed description thereof is omitted herein for brevity's sake. In some embodiments, memory modules 510 are disposed on the carrier 500. The memory modules 510 may include stacked semiconductor dies 520, 530. In some embodiments, at least one of the semiconductor dies 520 or 530 is a memory die. In some embodiments, both of the semiconductor dies 520 and 530 are memory dies. In the memory modules 510, the semiconductor dies 530 may be stacked on the semiconductor dies 520, and the semiconductor dies 520 may be disposed with top surfaces 520t facing the backside surfaces 530b of the semiconductor dies 530. The top surfaces 520t and 530t of the semiconductor dies 520 and 530 coincides with the active surfaces (the surfaces 520t and 530t exposing the conductive posts—or contact pads—522 and 532, respectively). In some embodiments, a memory module 510 may include a passivation layer 540 covering the top surface 520t of the semiconductor die 520, and the semiconductor die 530 may be disposed on the passivation layer 540. In some embodiments, the passivation layer 540 has openings exposing the contact pads 522 of the semiconductor die 520. TIVs 550 may be disposed on the passivation layer 540, contacting the semiconductor dies 520 through the openings of the passivation layer 540. In some embodiments, the semiconductor dies 520, 530, the passivation layer 540 and the TIVs 550 may be encapsulated by an encapsulant 560. In some embodiments, the encapsulant 560 leaves exposed the top surface 530t of the semiconductor dies 530 and the top surface 550t of the TIVs 550. In some embodiments, the top surfaces 550t of the TIVs 550 are substantially flush with the top surface 530t of the semiconductor dies 530. In some embodiments, the semiconductor dies 520 and 530 are not electrically connected within a memory module 510. It should be noted that while the memory modules 510 in FIG. 4A are illustrated as including two tiers of semiconductor dies (a lower tie with the semiconductor die 520 and an upper tier with the semiconductor die 530), the disclosure is not limited thereto. In some embodiments, the memory modules 510 may include more then two tiers of semiconductor dies, with the dies of the upper tiers vertically stacked with the dies of the lower tiers. In some embodiments, the semiconductor dies 530 of the upper tier are stacked on the semiconductor dies 520 of the lower tier so as to leave exposed the contact pads 522 of the lower tier semiconductor dies 520. The TIVs 550 may compensate for the difference in level height between the contact pads 532 of the upper tier semiconductor dies 530 and the contact pads 522 of the lower tier semiconductor dies 530. In some embodiments, when more than two tiers of semiconductor dies 520, 530 are included in a memory module 510, multiple orders of TIVs 550 of height differing according to the tier may be included, so that it is possible to establish electrical connection also with the lower tier semiconductor dies 520. In some embodiments, the memory modules 510 are disposed on the carrier 500 with the top surfaces 520t, 530t of the semiconductor dies 520, 530 and the top surfaces 550t of the TIVs 550 facing away from the carrier 500.

Referring to FIG. 4B, in some embodiments, an encapsulant 570 is formed on the carrier 500 to laterally encapsulate the memory modules 510. In some embodiments, the encapsulant 570 may include a similar material and be fabricated via a similar process as what was described above for the encapsulant 150 (shown in FIG. 1B), and a detailed description thereof is omitted herein. In some embodiments, formation of the encapsulant 570 includes a planarization process, after which the top surface 570t of the encapsulant 570 is substantially flush with the top surfaces 530t of the semiconductor dies 530 and the top surfaces 550t of the TIVs 550 in the memory modules 510. Following the planarization process, the contact pads 532 of the semiconductor dies 530 and the TIVs 550 are not covered by the encapsulant 570. In some embodiments, an interface may be visible between the encapsulant 570 and the encapsulant 560 of the memory modules 510. In some embodiments, formation of the encapsulant 570 results in a memory wafer 580. That is, in some embodiments, the memory wafer 580 is a reconstructed wafer including multiple memory modules 510. The memory wafer 580 may be used in place of the memory wafer 100 (shown in FIG. 1A) or the memory wafer 340 (shown in FIG. 3B) to produce a wafer-size semiconductor package according to some embodiments of the disclosure, following a similar process as discussed above with reference to FIG. 1B to FIG. 1F. For example, a passivation layer 590 may be formed on the memory wafer 580, covering the encapsulant 570 and the memory modules 510. Referring to FIG. 4C, openings 592 may be formed in the passivation layer 590 to expose the contact pads 532 of the semiconductor dies 530 and the TIVs 550. TIVs 600 may be formed over the memory wafer 580, filling the openings 592 to be electrically connected to the memory modules 510. In some embodiments, a portion of the TIVs 600 contacts the semiconductor dies 530, and a second portion of the TIVs 600 contacts the semiconductor dies 520 through the TIVs 550. In some embodiments, semiconductor dies 610 are disposed on the passivation layer 590 beside the TIVs 600. The semiconductor dies 610 may be disposed in a face-up configuration, with an active surface 610t exposing conductive posts (or contact pads) 612 facing away from the memory wafer 580. In some embodiments, at least one of the semiconductor dies 610 is a logic die. An encapsulant 620 may be provided over the memory wafer 580 to wrap the semiconductor dies 610 and the TIVs 600. A top surface 620t of the encapsulant 620 may be substantially at the same level height as the top surfaces 600t of the TIVs 600 and the top surfaces 610t of the semiconductor dies 610. With the formation of the encapsulant 620, a reconstructed wafer 630 is formed. The reconstructed wafer 630 includes the memory wafer 580 and the encapsulated semiconductor dies 610.

Figure 4D:
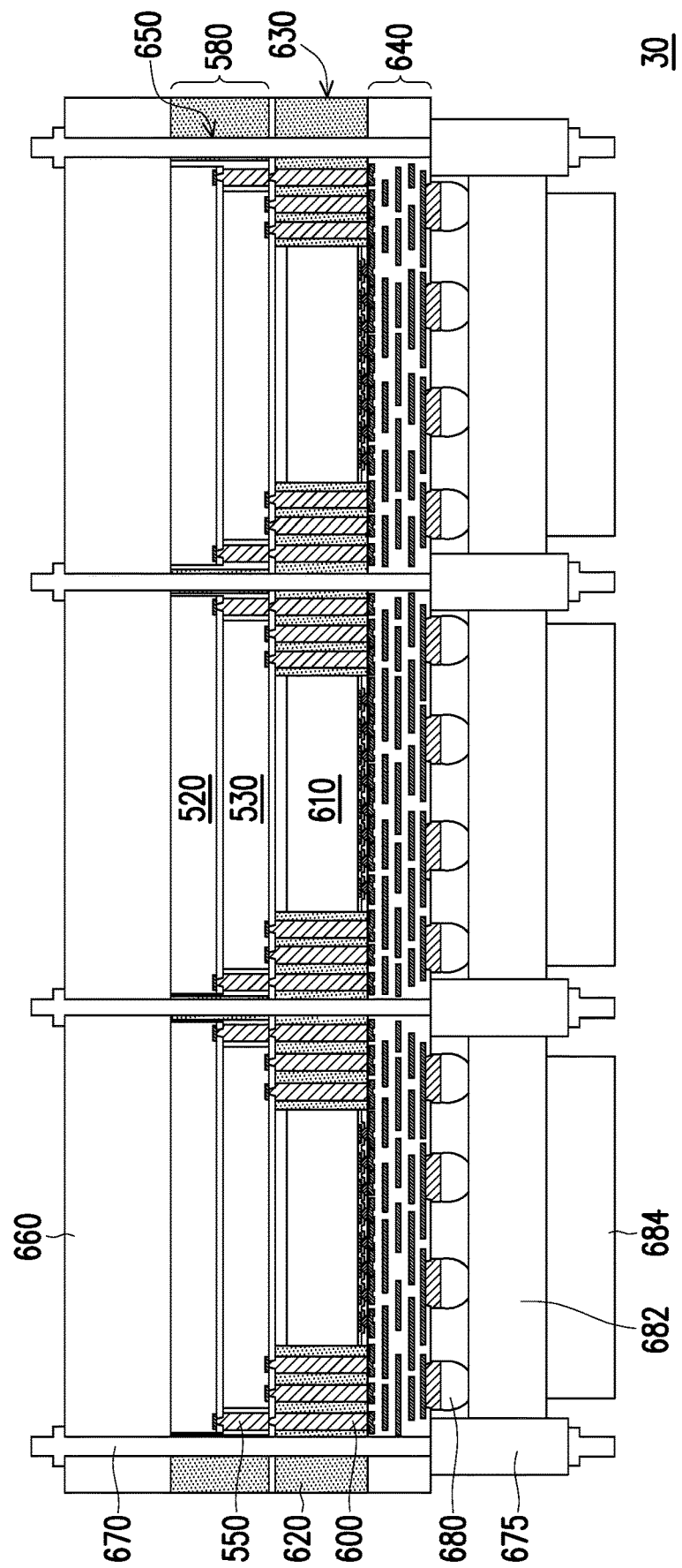

In some embodiments, the reconstructed wafer 630 undergoes similar process steps to the ones discussed above with references to FIG. 1C to FIG. 1F for the reconstructed wafer 160 to produce a semiconductor package 30 (shown in FIG. 4D). Namely, a redistribution structure 640 may be formed on the reconstructed wafer 630 on top of the encapsulant 620 and the semiconductor dies 610. The redistribution structure 640 interconnect the semiconductor dies 610 to the semiconductor dies 530 through the TIVs 600 and to the semiconductor dies 520 through the TIVs 600 and 550. In the semiconductor package 30, the memory modules 510 included in the memory wafer 580 are vertically stacked with the semiconductor dies 610, with the semiconductor dies 610 disposed between the memory modules 510 and the redistribution structure 640. Subsequently, screw holes 650 may be formed through the reconstructed wafer 630. A heat sink 660 may be connected to the reconstructed wafer 630 on the side of the memory wafer 580. The heat sink 660 may be secured with screws (or bolts) 670 and nuts 675 to the reconstructed wafer 630. Connectors 680 may be formed on a surface of the redistribution structure 640 further away from the reconstructed wafer 630. A socket 682 having power module(s) 684 disposed on top may be connected to the redistribution structure 640 via the connectors 680. In some embodiments, the reconstructed wafer 630 is included in the semiconductor package 30 without being singulated. In some embodiments, the carrier 500 (shown in FIG. 4C) may be removed at a certain point during the manufacturing process. For example, the carrier 500 may be removed after formation of the redistribution structure 640 or the connectors 680.

Figure 4E:
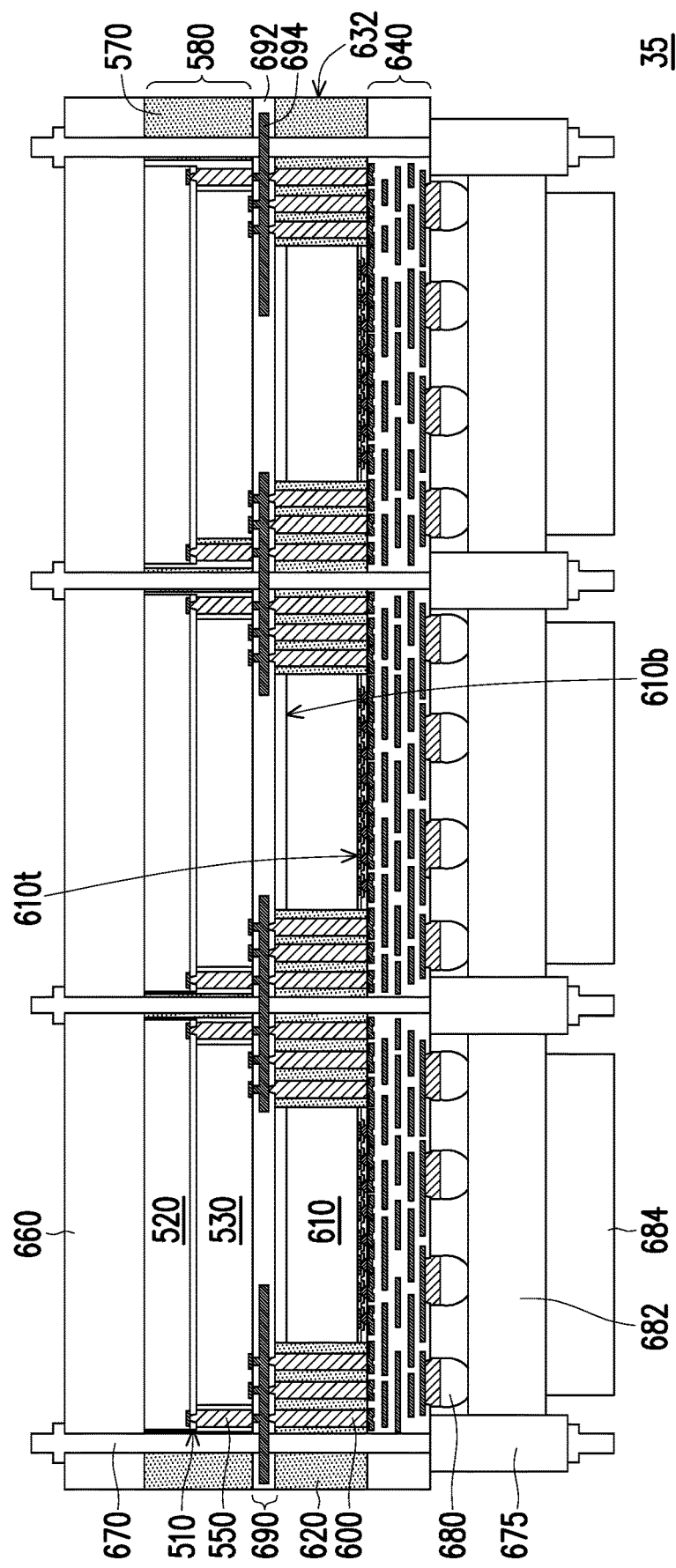
FIG. 4E is a schematic cross-sectional view of a semiconductor package according to some embodiments of the present disclosure.

FIG. 4E is a schematic cross-sectional view of a semiconductor package 35 according to some embodiments of the disclosure. Briefly, the semiconductor package 35 includes the reconstructed wafer 632 which includes the memory wafer 580, the encapsulated semiconductor dies 610 and TIVs 600, and a redistribution structure 690. That is, in the semiconductor package 35, the redistribution structure 690 is formed on the encapsulant 570 and the memory modules 510 of the memory wafer 580 before forming the TIVs 600 or providing the semiconductor dies 610. The redistribution structure 690 may include dielectric layer(s) 692 and redistribution conductive patterns 694 providing electrical connection between the memory modules 510 of the memory wafer 580 and the TIVs 600. In some embodiments, the redistribution structure 690 connects a semiconductor die 610 to a nearby memory module 510 encapsulated in the memory wafer 580. In some embodiments, the redistribution structure 690 may also interconnect nearby memory modules 510 of the memory wafer 580. In some embodiments, the semiconductor dies 610 are disposed on the redistribution structure 690 with active surfaces 610t directed towards the redistribution structure 640 and backside surfaces 610b facing the redistribution structure 690.

Figure 5C:
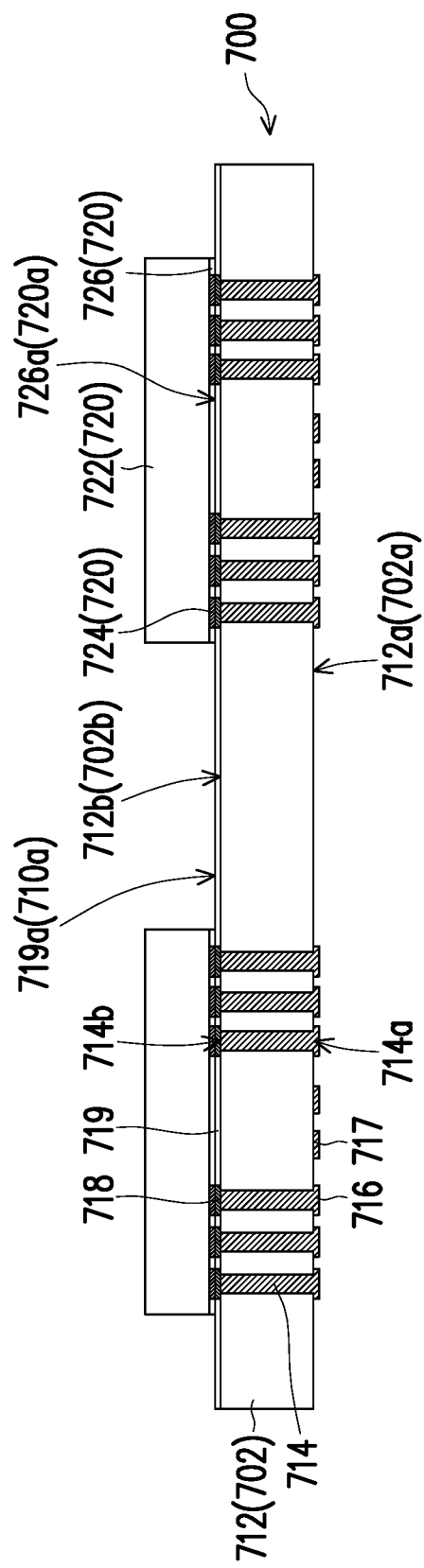

FIG. 5A to FIG. 5H are schematic cross-sectional views of structures produced at various stages of a manufacturing method of a semiconductor package 40 according to some embodiments of the present disclosure. In some embodiments, referring to FIG. 5A, a semiconductor wafer 700 is provided having semiconductor dies 710 formed therein. In some embodiments, the semiconductor dies 710 are or include logic dies. In some embodiments, each semiconductor die 710 includes a semiconductor substrate 712 and through semiconductor vias (TSVs) 714 formed in the semiconductor substrate 712. In some embodiments, the semiconductor substrate 712 corresponds to a portion of the substrate 702 of the semiconductor wafer 700. In some embodiments, the TSVs 714 penetrate within the semiconductor substrate 712 for a portion of its thickness. That is, one end 714a of a TSV 714 may emerge from a first surface 712a of the semiconductor substrate 712, while the other end 714b of the TSV 714 may be initially buried within the semiconductor substrate 712. The surface 712a is a portion of a surface 702a of the substrate 702 of the semiconductor wafer 700. In some embodiments, pads 716 are formed at the first end 714a of the TSVs 714. The pads 716 cover the first ends 714a of the TSVs 714 and may partially extend over the semiconductor substrate 712. In some embodiments, the pads 716 and the underlying TSVs 714 may include the same materials. In some embodiments, a material of the pads 716 includes aluminum, titanium, copper, nickel, tungsten, or alloys thereof. In some embodiments, additional layers (e.g., BEOL layers and oxide layers, not shown) may be disposed between the TSVs 714 and the overlying pads 716 and between the TSVs 714 and the semiconductor substrate 712. Referring to FIG. 5A and FIG. 5B, in some embodiments the semiconductor wafer 700 may be grinded from a surface 702b opposite to the surface 702a until the other end 714b of the TSVs 714 is exposed. In some embodiments, the wafer grinding includes performing a mechanical grinding process and/or a chemical mechanical polishing (CMP) process. In some embodiments, referring to FIG. 5C, bonding pads 718 and a bonding dielectric layer 719 are formed on the surface 702b of the semiconductor substrate 702. In some embodiments, the bonding pads 718 are formed on the exposed other end 714b of the TSVs 714, and the bonding dielectric layer 719 is formed beside the bonding pads 718 to cover the surface 702b of the semiconductor substrate 702. In some embodiments, a planarization process may be performed on the bonding pads 718 and the bonding dielectric layer 719 to ensure that the exposed surface 719a of the bonding dielectric layer 719 is substantially flush with the bonding pads 718 and of adequate flatness for further processing. In some embodiments, a material of the bonding pads 718 includes aluminum, titanium, copper, nickel, tungsten, or alloys thereof. In some embodiments, a material of the bonding dielectric layer 719 includes oxides, such as silicon dioxide, nitrides, organic dielectric materials (e.g., epoxy resins), or other suitable dielectric materials. Referring to FIG. 5C, in some embodiments semiconductor dies 720 may be bonded to the semiconductor wafer 700 from the side of the surface 702b, where the bonding pads 718 and the dielectric bonding layer 719 are formed. In some embodiments, the semiconductor dies 720 includes a semiconductor substrate 722, and bonding pads 724 and a bonding dielectric layer 726 formed on a surface of the semiconductor substrate 722. In some embodiments, the semiconductor dies 720 are or include memory dies.

In some embodiments, the semiconductor dies 720 are hybrid-bonded to the semiconductor wafer 700. In some embodiments, a temperature of the hybrid bonding process ranges from about 200° C. to about 300° C. In some embodiments, the surface 719a of the bonding dielectric layer 719 with the exposed bonding pads 718 and the surface 726a of the bonding dielectric layer 726 with the exposed bonding pads 724 are referred to as active surfaces 710a and 720a for the semiconductor dies 710 and 720, respectively. In some embodiments, the semiconductor dies 720 may be picked-and-placed onto the active surfaces 710a of the semiconductor dies 710 such that the semiconductor dies 720 are electrically connected to the semiconductor dies 710. In some embodiments, the semiconductor dies 720 are placed such that the active surfaces 720a of the semiconductor dies 720 are in contact with the active surfaces 710a of the semiconductor dies 710. Furthermore, the bonding pads 724 of the semiconductor dies 720 are substantially aligned and in direct contact with the bonding pads 718 of the semiconductor dies 710. In some embodiments, the semiconductor dies 720 cover only some of the bonding pads 718, and some bonding pads 718 may be left exposed after the semiconductor dies 720 are bonded. In some embodiments, to facilitate the hybrid bonding between the semiconductor dies 720 and the semiconductor dies 710, surface preparation for the active surfaces 720a and 710a may be performed. The surface preparation may include surface cleaning and activation, for example. Surface cleaning may be performed on the active surfaces 710a, 720a to remove particles from the bonding surfaces of the bonding pads 718 and 724 and the bonding surfaces 719a, 726a of the bonding dielectric layers 719 and 726. In some embodiments, the active surfaces 710a, 720a may be cleaned by wet cleaning, for example.

After cleaning the active surfaces 710a and 720a, activation of the bonding surfaces 719a and 726a of the bonding dielectric layers 719 and 726 may be performed for development of high bonding strength. For example, plasma activation may be performed to treat the bonding surfaces 719a and 726a. When the activated bonding surfaces 719a, 726a are in contact with each other, the bonding dielectric layers 719 and 726 are pre-bonded. After pre-bonding the semiconductor dies 720 onto the semiconductor wafer 700, a hybrid bonding step is performed. The hybrid bonding step may include a thermal treatment for dielectric bonding and a thermal annealing for conductor bonding. In some embodiments, the thermal treatment for dielectric bonding is performed to strengthen the bonding between the dielectric bonding layer 719 and the bonding dielectric layer 726. After performing the thermal treatment for dielectric bonding, the thermal annealing for conductor bonding is performed to facilitate the bonding between the bonding pads 718 and 724. In some embodiments, the process temperature of the thermal annealing for conductor bonding is higher than that of the thermal treatment for dielectric bonding.

After performing the thermal annealing for conductor bonding, the dielectric bonding layer 719 is bonded to the bonding dielectric layer 726, and the bonding pads 718 are bonded to the underlying bonding pads 724. As such, the semiconductor dies 720 are hybrid bonded to the semiconductor dies 710.

Figure 5D:
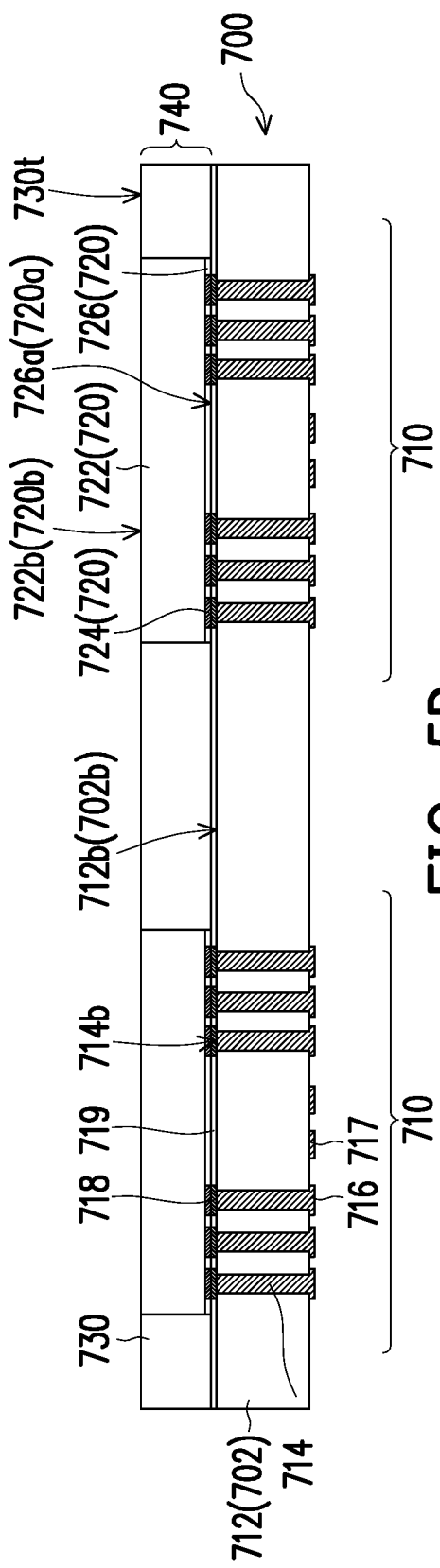

Referring to FIG. 5C and FIG. 5D, a filling process is performed to form an encapsulant 730 over the semiconductor wafer 700 to encapsulate the semiconductor dies 720. In some embodiments, the encapsulant 730 may be formed so as to fill gaps between the semiconductor dies 720 over the semiconductor wafer 700. In some embodiments, the encapsulant 730 may be formed to be substantially level with the backside surfaces 720b of the semiconductor dies 720. That is, the top surface 730t of the encapsulant 730 may be at substantially the same level height as the backside surfaces 722b. However, the disclosure is not limited thereto. In some alternative embodiments, the encapsulant 730 may cover the backside surfaces 720b of the semiconductor dies 720. In some embodiments, a material of the encapsulant 730 includes inorganic materials such as silicon oxide, silicon nitride, or the like. In some alternative embodiments, a material of the encapsulant 730 includes a molding compound, a polymeric material, such as polyimide, epoxy resin, acrylic resin, phenol resin, BCB, PBO, a combination thereof, or other suitable polymer-based dielectric materials. In some embodiments, the encapsulant 730 may be formed by suitable processes, such as CVD, plasma-enhanced chemical vapor deposition (PECVD), atomic layer deposition (ALD), or the like. In some embodiments, the semiconductor dies 720 encapsulated by the encapsulant 730 may be considered as forming a memory wafer 740 bonded to the semiconductor wafer 700.

Figure 5E:
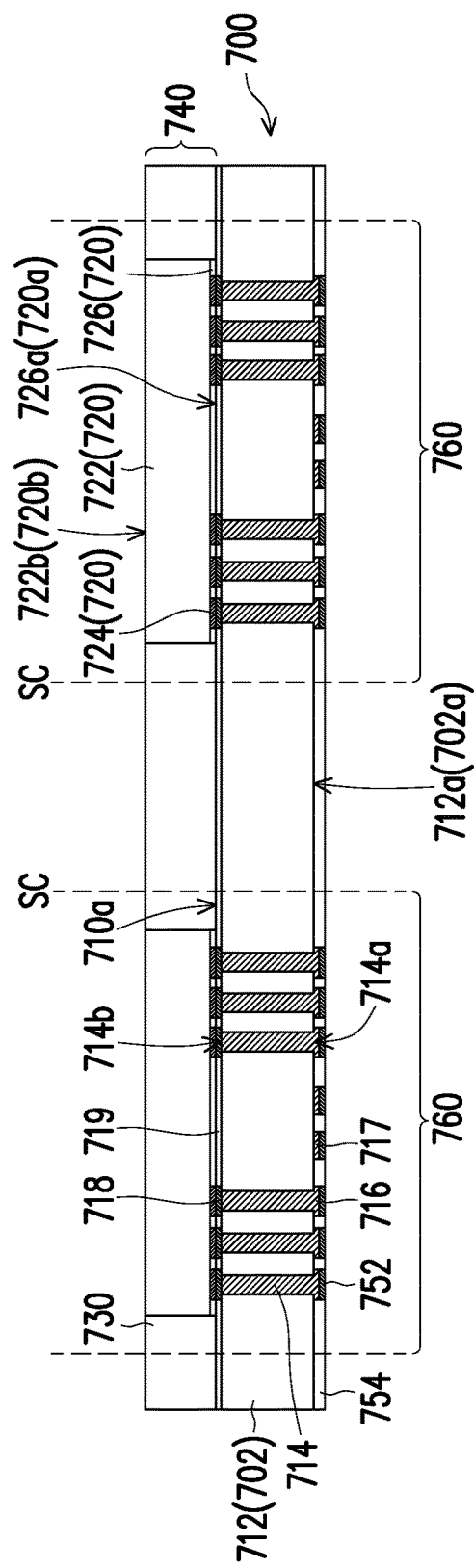

In some embodiments, referring to FIG. 5E, after formation of the encapsulant 730 the semiconductor wafer 700 and the memory wafer 740 may be overturned to further process from the side of the surface 712a. In some embodiments, contact pads 752 may be formed on the pads 716 and 717 and a passivation layer 754 may be formed on the surface 712a. The passivation layer 754 exposes the contact pads 752. In some embodiments, a material of the contact pads 752 may include suitable metal material, such as copper. In some embodiments, a planarization process may be performed to ensure adequate flatness of the passivation layer 754 with respect to the contact pads 752 for subsequent processing. In some embodiments, after formation of the passivation layer 754 and the contact pads 752, the semiconductor wafer 700 and the memory wafer 740 may be diced, for example by cutting along the scribe lines SC, to produce die modules 760. In some embodiments, each of the die modules 760 includes a semiconductor die 710 having one or more semiconductor dies 720 bonded on the surface 710a. In some embodiments, the semiconductor dies 720 are stacked within the die modules 760 with the semiconductor dies 710. In some embodiments, the TSVs 714 may provide vertical connection through the semiconductor dies 710 for the semiconductor dies 720. That is, some of the contact pads 752 may be electrically connected to the semiconductor dies 720 through the TSVs 714. It should be noted that while the die modules 760 in FIG. 5E are illustrated as including two tiers of the semiconductor dies (a lower tie with the semiconductor die 710 and an upper tier with the semiconductor die 720), the disclosure is not limited thereto. In some embodiments, the die modules 760 may include more then two tiers of semiconductor dies, with the dies of the upper tiers vertically stacked with the dies of the lower tiers.

Figure 5F:
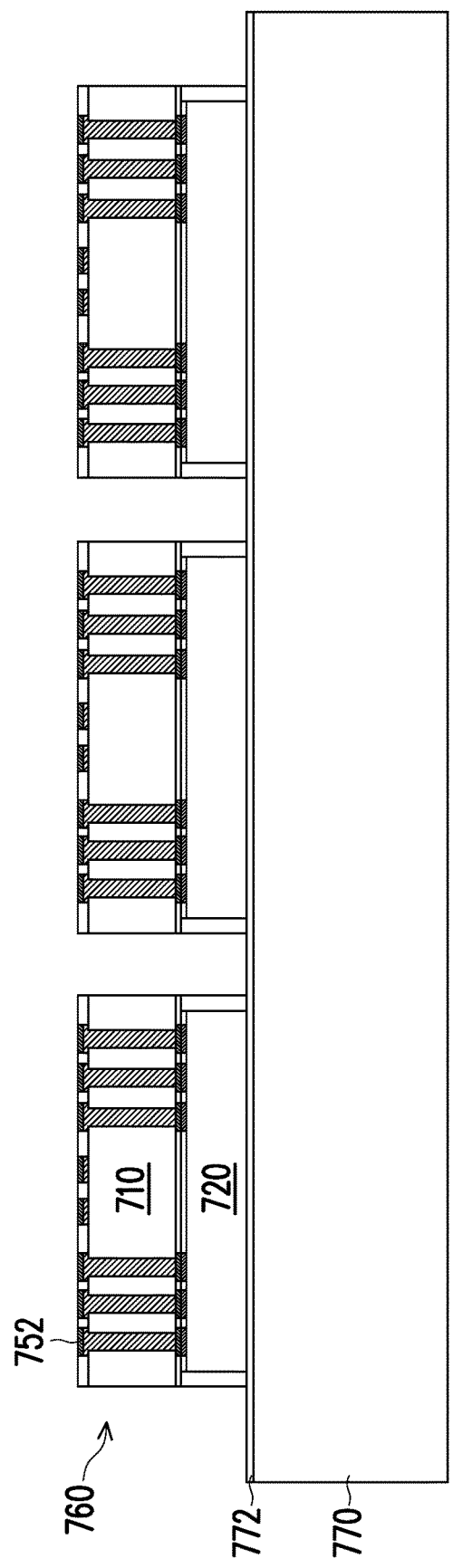
Figure 5G:
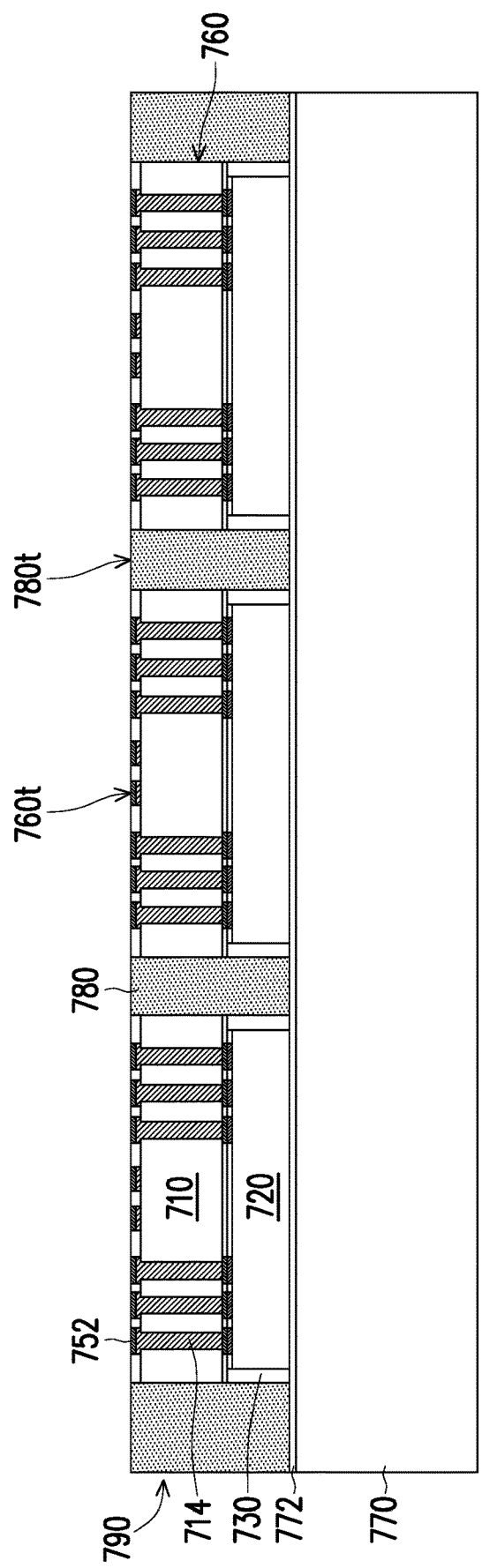

Referring to FIG. 5F, in some embodiments the die modules 760 are disposed on a carrier 770. The carrier 770 may be similar to the carrier 300, and a detailed description thereof is omitted herein for brevity's sake. In some embodiments, the die modules 760 are disposed on the carrier 770 with the contact pads 752 facing away from the carrier 500. Referring to FIG. 5G, in some embodiments, an encapsulant 780 is formed on the carrier 770 to laterally encapsulate the die modules 760. In some embodiments, the encapsulant 780 may include a similar material and be fabricated via a similar process as what was described above for the encapsulant 150 (shown in FIG. 1B), and a detailed description thereof is omitted herein. In some embodiments, formation of the encapsulant 780 includes a planarization process, after which the top surface 780t of the encapsulant 780t is substantially flush with the active surfaces 760t of the die modules 760 (the surfaces where the contact pads 752 are exposed). Following the planarization process, the contact pads 752 of the die modules 760 are not covered by the encapsulant 780. In some embodiments, an interface may be visible between the encapsulant 780 and the encapsulant 730 of the die modules 760. In some embodiments, the encapsulant 780 is in physical contact with the semiconductor dies 710, while is separated from the semiconductor dies 720 by the encapsulant 730. In some embodiments, formation of the encapsulant 780 results in a reconstructed wafer 790. The reconstructed wafer 790 includes the encapsulated die modules 760.

Figure 5H:
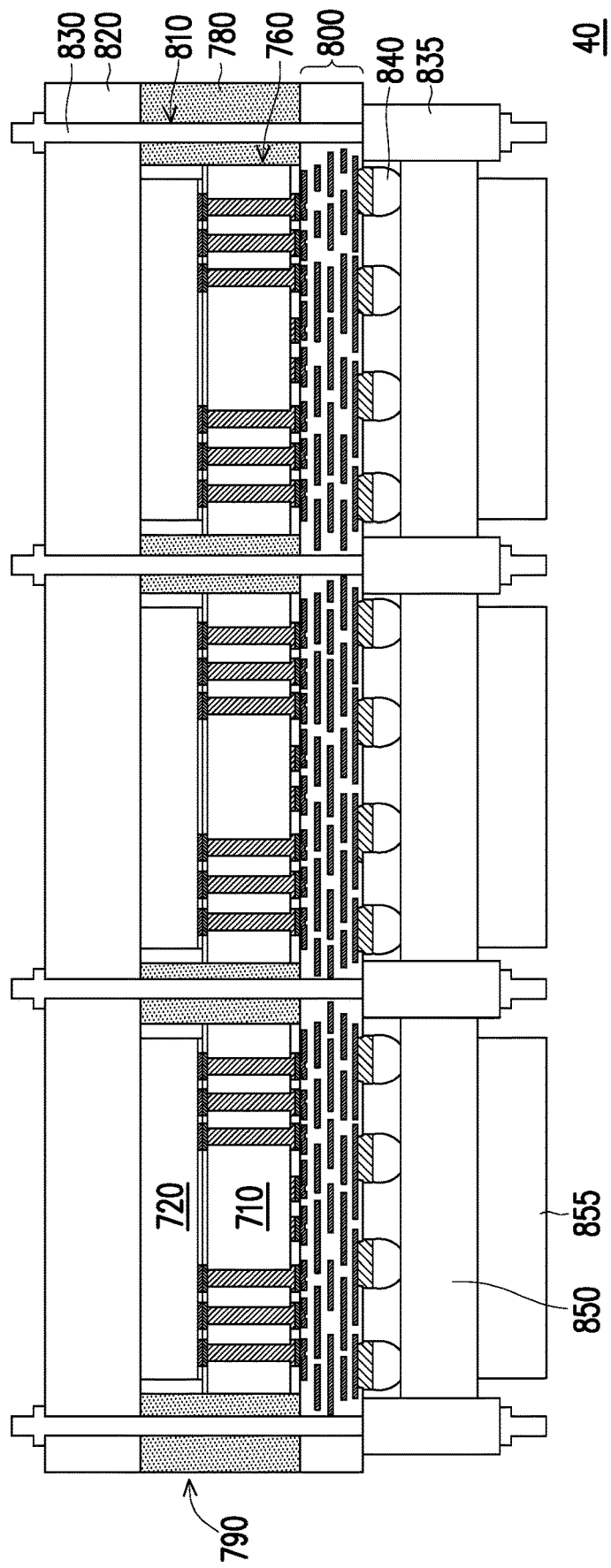

In some embodiments, the reconstructed wafer 790 undergoes similar process steps to the ones discussed above with references to FIG. 1C to FIG. 1F for the reconstructed wafer 160 to produce a semiconductor package 40 (shown in FIG. 5H). Namely, a redistribution structure 800 may be formed on the reconstructed wafer 790 on top of the encapsulant 780 and the die modules 760. The redistribution structure 800 is connected to the semiconductor dies 710 and 720 disposed in the die modules 760 via the contact pads 752. In some embodiments, the redistribution structure is connected directly to the semiconductor dies 710 and to the semiconductor dies 720 via the TSVs 714. In the semiconductor package 40, the semiconductor dies 720 are vertically stacked with the semiconductor dies 710, with the semiconductor dies 710 disposed between the semiconductor dies 720 and the redistribution structure 800. After formation of the redistribution structure 800, screw holes 810 may be formed through the reconstructed wafer 790. A heat sink 820 may be connected to the reconstructed wafer 790 on the side of the semiconductor dies 720. The heat sink 820 may be secured with screws (or bolts) 830 and nuts 835 to the reconstructed wafer 790. Connectors 840 may be formed on a surface of the redistribution structure 800 further away from the reconstructed wafer 790. A socket 850 having power module(s) 855 disposed on top may be connected to the redistribution structure 800 via the connectors 840. In some embodiments, the reconstructed wafer 160 may be incorporated in the semiconductor package 40 without being singulated. In some embodiments, the carrier 770 (shown in FIG. 5G) may be removed at a certain point during the manufacturing process. For example, the carrier 770 may be removed after formation of the redistribution structure 800 or the connectors 840.

FIG. 6A to FIG. 6E are schematic cross-sectional views of structures produced at various stages of a manufacturing method of a semiconductor package 50 according to some embodiments of the present disclosure. In some embodiments, referring to FIG. 6A, a semiconductor wafer 900 is provided having semiconductor dies 910 formed therein. In some embodiments, the semiconductor dies 910 are or include logic dies. In some embodiments, each semiconductor die 910 includes a semiconductor substrate 912 and bonding pads 914 disposed on a top surface 912a of the semiconductor substrate 912. In some embodiments, the semiconductor substrate 912 corresponds to a portion of the substrate 902 of the semiconductor wafer 900. The bonding pads 914 surrounded by a bonding dielectric layer 916 that covers the portions of the top surface 912a where the bonding pads 914 are not formed. In some embodiments, the top surface 916a of the bonding dielectric layer 916 and the bonding pads 914 form an active surface 910a for a semiconductor die 910. In some embodiments semiconductor dies 920 may be bonded to the semiconductor wafer 900 on the active surfaces 910a. In some embodiments, the semiconductor dies 920 include a semiconductor substrate 922 crossed from side to side by TSVs 924, and bonding pads 926 and a bonding dielectric layer 928 formed on a surface 922a of the semiconductor substrate 922. In some embodiments, the TSVs 924 penetrates within the semiconductor substrate 922 for its entire thickness. That is, one end 924a of a TSV 924 may emerge from the surface 922a of the semiconductor substrate 922 where the bonding pads 926 are formed, while the other end 924b of the TSV 924 may emerge from a surface 922b opposite to the surface 922a. In some embodiments, the semiconductor dies 920 are or include memory dies. In some embodiments, the surface 928a of the bonding dielectric layer 928 further away from the semiconductor substrate 922 and the bonding pads 926 may form an active surface 920a of the semiconductor die 920.

Figure 6A:
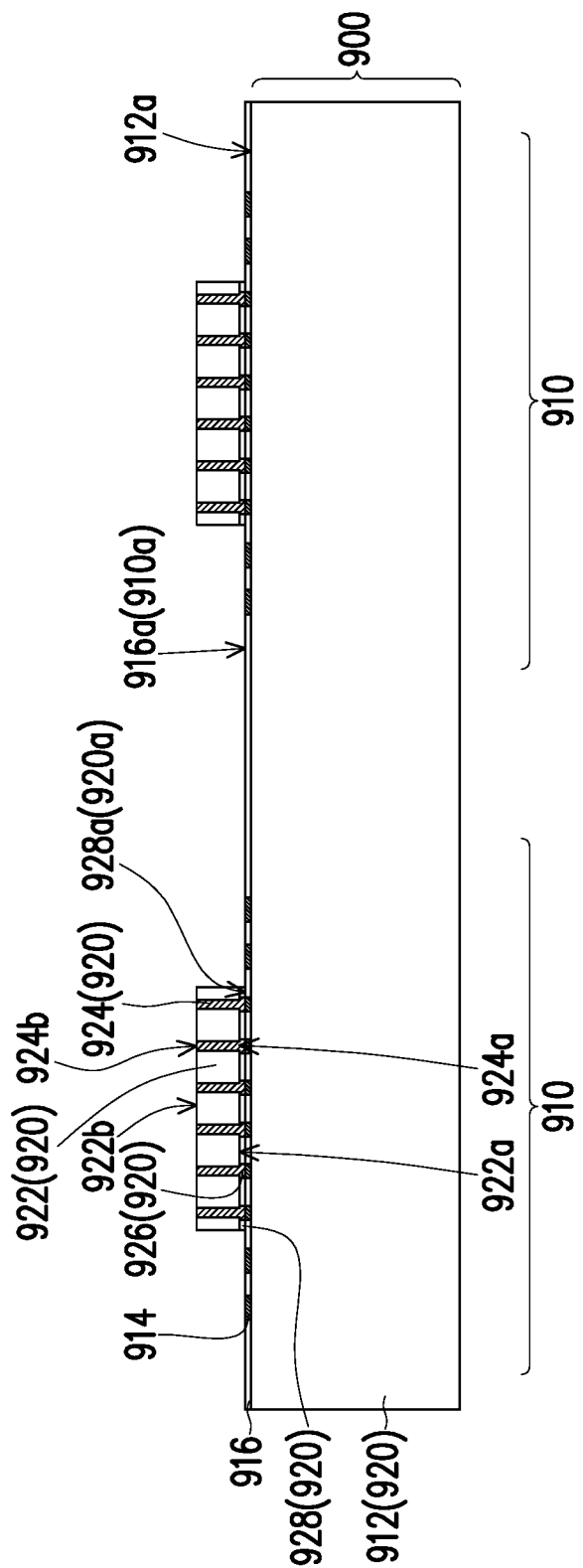
Figure 6B:
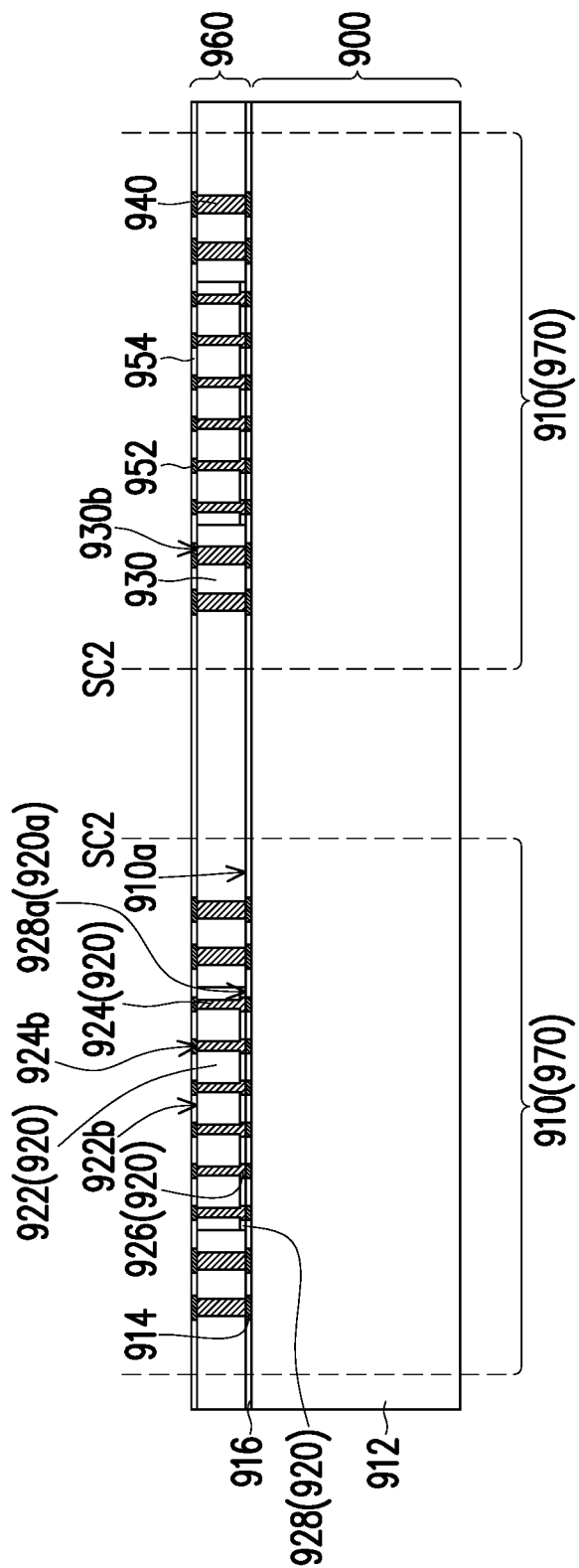

In some embodiments, the semiconductor dies 920 are hybrid-bonded to the semiconductor dies 910 formed in the semiconductor wafer 900. In some embodiments, the semiconductor dies 920 are picked-and-placed onto the active surfaces 910a of the semiconductor dies 910 such that the active surfaces 920a of the semiconductor dies 920 are in direct contact with the active surfaces 910a of the semiconductor dies 910. Furthermore, the bonding pads 920 of the semiconductor dies 920 are substantially aligned and in direct contact with the bonding pads 914 of the semiconductor dies 910. In some embodiments, the semiconductor dies 920 cover only some of the bonding pads 914, and some other bonding pads 914 are left exposed after the semiconductor dies 920 are bonded. Referring to FIG. 6A and FIG. 6B, a filling process is performed to form an encapsulant 930 over the semiconductor wafer 900 to encapsulate the semiconductor dies 920. In some embodiments, the encapsulant 930 may be formed so as to fill gaps between the semiconductor dies 930 over the semiconductor wafer 700. In some embodiments, the encapsulant 930 may be formed to be substantially level with the backside surfaces 920b of the semiconductor dies 920. In some embodiments, the encapsulant 930 may be formed by suitable processes, such as CVD, plasma-enhanced chemical vapor deposition (PECVD), atomic layer deposition (ALD), or the like. In some embodiments, through holes may be opened in the encapsulant 930 to form TIVs 940 over the bonding pads 914 left exposed by the semiconductor dies 920. In some embodiments, the TIVs 940 may be formed by filling the through holes formed in the encapsulant 930 with a conductive material. After formation of the TIVs 940, contact pads 952 may be formed on the exposed ends 924b and 930b of the TSVs 924 and 930, respectively, and a passivation layer 954 may be formed on the encapsulant 930 and the exposed portions of the semiconductor substrates 922. The passivation layer 954 leaves exposed the contact pads 952.

In some embodiments, a planarization process may be performed to ensure adequate flatness of the passivation layer 954 with respect to the contact pads 952 for subsequent processing. In some embodiments, the semiconductor dies 920 and the TIVs 940 encapsulated by the encapsulant 930 may be considered as forming a memory wafer 960 bonded to the semiconductor wafer 900.

In some embodiments, after formation of the passivation layer 954 and the contact pads 952, the semiconductor wafer 900 and the memory wafer 960 may be diced, for example by cutting along the scribe lines SC, to produce die modules 970. In some embodiments, each of the die modules 970 includes a semiconductor die 910 having one or more semiconductor dies 920 bonded to the active surface 910a. In some embodiments, the semiconductor dies 920 are stacked within the die modules 970 with the semiconductor dies 910. In some embodiments, the TSVs 924 provide vertical connection through the semiconductor dies 920 for the semiconductor dies 910. Similarly, the TIVs 940 provide vertical connection through the encapsulant 930. That is, some of the contact pads 752 may be electrically connected to the semiconductor die 910 through the TSVs 924 and the TIVs 940. It should be noted that while the die modules 970 in FIG. 6B are illustrated as including two tiers of the semiconductor dies (a lower tie with the semiconductor die 910 and an upper tier with the semiconductor die 920), the disclosure is not limited thereto. In some embodiments, the die modules 970 may include more then two tiers of semiconductor dies, with the dies of the upper tiers vertically stacked on the dies of the lower tiers.

Referring to FIG. 6C, in some embodiments the die modules 970 are disposed on a carrier 980. The carrier 980 may be similar to the carrier 300, and a detailed description thereof is omitted herein for brevity's sake. In some embodiments, the die modules 970 are disposed on the carrier 980 with the contact pads 952 facing away from the carrier 980. Referring to FIG. 6D, in some embodiments, an encapsulant 990 is formed on the carrier 980 to laterally encapsulate the die modules 970. In some embodiments, the encapsulant 990 may include a similar material and be fabricated via a similar process as what was described above for the encapsulant 150 (shown in FIG. 1B), and a detailed description thereof is omitted herein. In some embodiments, formation of the encapsulant 990 includes a planarization process, after which the top surface 990t of the encapsulant 990 is substantially flush with the surfaces of the die modules 970 where the contact pads 952 are exposed. Following the planarization process, the contact pads 952 of the die modules 970 are not covered by the encapsulant 990. In some embodiments, an interface may be visible between the encapsulant 990 and the encapsulant 930 of the die modules 970. In some embodiments, the encapsulant 990 is in physical contact with the semiconductor dies 910, while is separated from the semiconductor dies 920 by the encapsulant 930. In some embodiments, formation of the encapsulant 990 results in a reconstructed wafer 1000. The reconstructed wafer 1000 includes the encapsulated die modules 970.

Figure 6E:
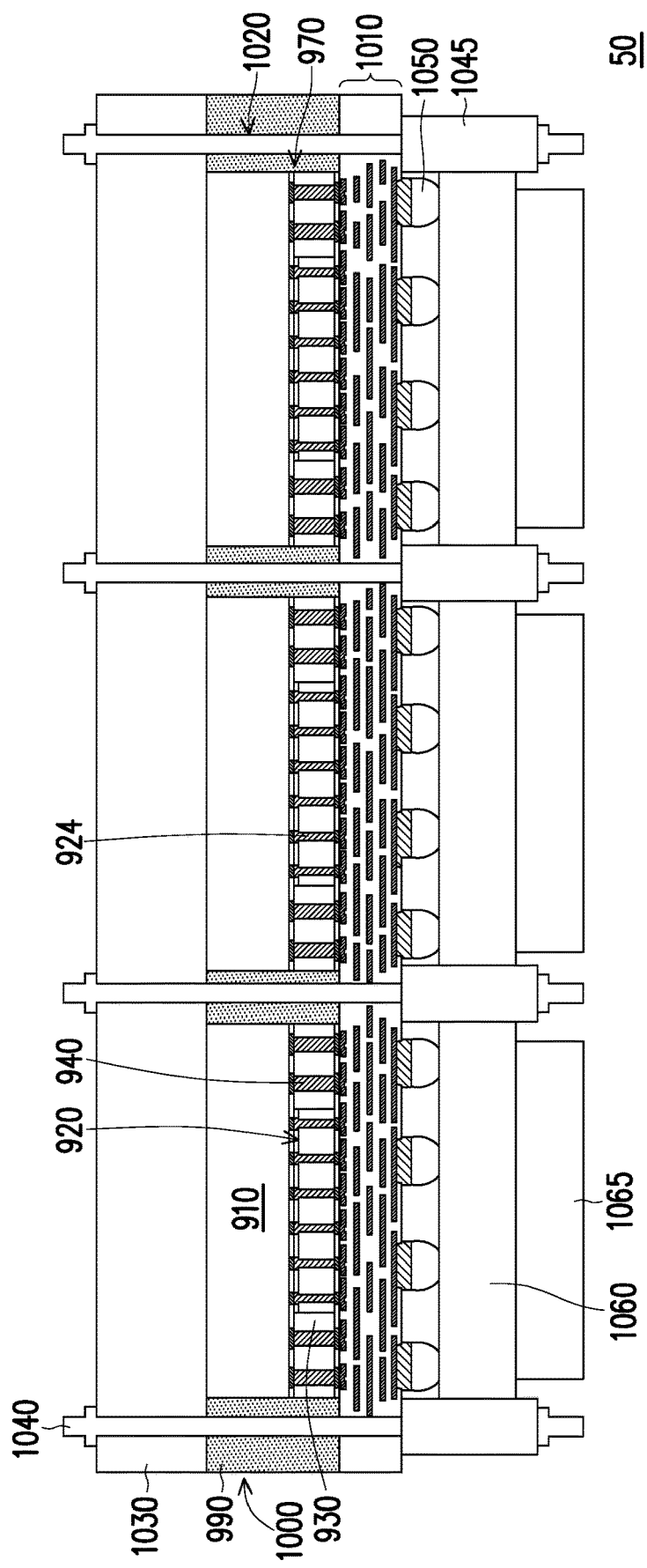

In some embodiments, the reconstructed wafer 1000 undergoes similar process steps to the ones discussed above with references to FIG. 1C to FIG. 1F for the reconstructed wafer 160 to produce a semiconductor package 50 (shown in FIG. 6E). Namely, a redistribution structure 1010 may be formed on the reconstructed wafer 1000 on top of the encapsulant 990 and the die modules 970. The redistribution structure 1010 is connected to the semiconductor dies 910 and 920 of the die modules 970 via the contact pads 952. In some embodiments, the redistribution structure 1010 is connected directly to the semiconductor dies 920 and to the semiconductor dies 910 via the TSVs 924 and the TIVs 940. In the semiconductor package 50, the semiconductor dies 910 are vertically stacked on the semiconductor dies 920, with the semiconductor dies 920 disposed between the semiconductor dies 910 and the redistribution structure 1010. After formation of the redistribution structure 1010, screw holes 1020 may be formed through the reconstructed wafer 1000. A heat sink 1030 may be connected to the reconstructed wafer 1000 on the side of the semiconductor dies 910. The heat sink 1030 may be secured with screws (or bolts) 1040 and nuts 1045 to the reconstructed wafer 1000. Connectors 1050 may be formed on a surface of the redistribution structure 1010 further away from the reconstructed wafer 1000. A socket 1060 having power module(s) 1065 disposed on top may be connected to the redistribution structure 1010 via the connectors 1050. In some embodiments, the reconstructed wafer 1000 may be incorporated in the semiconductor package 50 without being singulated. In some embodiments, the carrier 980 (shown in FIG. 6D) may be removed at a certain point during the manufacturing process. For example, the carrier 980 may be removed after formation of the redistribution structure 1010 or the connectors 1050.

In accordance with some embodiments of the disclosure, a semiconductor package is provided. The semiconductor package includes a redistribution structure, a memory wafer, semiconductor dies and conductive vias. The memory wafer is disposed over the redistribution structure, and includes at least one memory die. The semiconductor dies are disposed side by side with respect to each other, between the memory wafer and the redistribution structure, and are electrically connected to the redistribution structure. The conductive vias electrically connect the at least one memory die with the redistribution structure.

In accordance with some embodiments of the disclosure, a semiconductor package is provided. The semiconductor package includes a redistribution structure, a reconstructed wafer, and a heat sink. The reconstructed wafer is disposed on the redistribution structure. The reconstructed wafer includes logic dies and memory dies. The logic dies are electrically connected to the redistribution structure. The memory dies are electrically connected to the redistribution structure and vertically stacked with the logic dies. The heat sink is disposed on the reconstructed wafer. The heat sink is fastened to the reconstructed wafer.

In accordance with some embodiments of the disclosure, a manufacturing method of a wafer-size semiconductor package is provided. The method includes at least the following steps. A memory wafer including memory dies is provided. Logic dies are vertically stacked with the memory dies. A first encapsulant is formed encapsulating the logic dies. A redistribution structure is formed over the first encapsulant. The redistribution structure is electrically connected to the memory dies and the logic dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a redistribution structure;
    a memory wafer disposed over the redistribution structure, the memory wafer comprising at least one memory die, wherein the at least one memory die comprises a semiconductor substrate and contact pads disposed at a front surface of the semiconductor substrate;
    a passivation layer, extending on the memory wafer at the front surface of the semiconductor substrate, and comprising openings exposing the contact pads;
    semiconductor dies disposed side by side with respect to each other, between the memory wafer and the redistribution structure, separated from the memory wafer by the passivation layer, and electrically connected to the redistribution structure; and
    conductive vias, electrically connecting the at least one memory die with the redistribution structure, wherein the conductive vias extend from the redistribution structure to the contact pads of the at least one memory die, through the openings of the passivation layer to directly contact the contact pads of the at least one memory die.

2. The semiconductor package of claim 1, wherein the at least one memory die is a portion of a semiconductor wafer.

3. The semiconductor package of claim 1, wherein the at least one memory die is encapsulated in an encapsulant.

4. The semiconductor package of claim 3, wherein the encapsulant separates the at least one memory die from other memory dies included in the memory wafer.

5. The semiconductor package of claim 1, wherein the memory wafer includes encapsulated memory modules, the at least one memory die is included in one memory module of the memory modules, and the one memory module further comprises a second memory die stacked with the at least one memory die and connected to the redistribution structure.

6. The semiconductor package of claim 5, wherein the second memory die is connected to the conductive vias by through insulator vias included in the memory module.

7. The semiconductor package of claim 1, further comprising screw holes extending from an outer surface of the memory wafer to an outer surface of the redistribution structure.

8. A semiconductor package, comprising:
    a redistribution structure;
    a reconstructed wafer disposed on the redistribution structure, the reconstructed wafer comprising:
        logic dies electrically connected to the redistribution structure, and
        memory dies, electrically connected to the redistribution structure and vertically stacked with the logic dies; and
    a heat sink disposed on the reconstructed wafer,
    wherein the heat sink is fastened to the reconstructed wafer,
    the logic dies comprise first bonding dielectric layers and first bonding pads embedded in the first bonding dielectric layers,
    the memory dies comprise second bonding dielectric layers and second bonding pads embedded in the second bonding dielectric layers, and
    the first bonding pads are substantially aligned to and in direct contact with the second bonding pads.

9. The semiconductor package of claim 8, wherein front surfaces of the first bonding dielectric layers are flush with the first bonding pads, and front surfaces of the second bonding dielectric layers are flush with the second bonding pads.

10. The semiconductor package of claim 8, wherein the reconstructed wafer further comprises an encapsulant encapsulating the memory dies and through insulator vias extending through the encapsulant and connecting the logic dies to the redistribution structure.

11. The semiconductor package of claim 8, wherein the logic dies comprise:
   semiconductor substrates; and
   through semiconductor vias extending across the semiconductor substrates and connecting the memory dies to the redistribution structure.

12. The semiconductor package of claim 8, wherein the memory dies comprise:
   semiconductor substrates; and
   through semiconductor vias extending across the semiconductor substrates and connecting the logic dies to the redistribution structure.

13. The semiconductor package of claim 10, wherein the encapsulant contacts the first bonding dielectric layers of the logic dies.

14. A manufacturing method of a wafer-size semiconductor package, comprising:
   providing a memory wafer including memory dies;
   vertically stacking the memory dies with logic dies;
   forming a first encapsulant encapsulating the logic dies;
   forming a redistribution structure over the first encapsulant, the redistribution structure being electrically connected to the memory dies and the logic dies;
   disposing a heat sink in contact with the memory wafer; and
   fastening the heat sink to the memory wafer via screws disposed in screw holes extending through the memory wafer.

15. The manufacturing method of claim 14, wherein providing the memory wafer includes encapsulating the memory dies in a second encapsulant.

16. The manufacturing method of claim 15, wherein providing the memory wafer further includes stacking memory dies over each other before encapsulating the memory dies in the second encapsulant.

17. The manufacturing method of claim 14, further comprising laser drilling through the memory wafer, the first encapsulant, and the redistribution structure to open the screw holes.

18. The manufacturing method of claim 14, further comprising:
   forming another redistribution structure on the memory wafer before stacking the logic dies; and
   forming through insulator vias on the other redistribution structure,
   wherein the logic dies are stacked on the memory wafer with rear surfaces facing towards the other redistribution structure, and the through insulator vias connect the other redistribution structure to the redistribution structure.

19. The manufacturing method of claim 14, further comprising forming through insulator vias on the memory dies before forming the first encapsulant, wherein the memory dies are electrically connected to the logic dies through the through insulator vias and the redistribution structure.

20. The semiconductor package of claim 1, further comprising an encapsulant, disposed between the passivation layer and the redistribution structure to encapsulate the logic dies, wherein the conductive vias directly contact the encapsulant.

* * * * *